(12) United States Patent
Takashima

(10) Patent No.: US 6,487,104 B2
(45) Date of Patent: Nov. 26, 2002

(54) SEMICONDUCTOR MEMORY DEVICE

(75) Inventor: Daisaburo Takashima, Yokohama (JP)

(73) Assignee: Kabushiki Kaisha Toshiba, Kawasaki (JP)

(*) Notice: Subject to any disclaimer, the term of this patent is extended or adjusted under 35 U.S.C. 154(b) by 0 days.

(21) Appl. No.: 09/842,670

(22) Filed: Apr. 27, 2001

(65) Prior Publication Data

US 2001/0040814 A1 Nov. 15, 2001

(30) Foreign Application Priority Data

May 10, 2000 (JP) .................................... 2000-137098

(51) Int. Cl.[7] ............................................. G11C 11/22
(52) U.S. Cl. ............................................ 365/145; 365/149
(58) Field of Search ............................... 365/145, 149, 365/190, 203, 207, 189.04, 189.09

(56) References Cited

U.S. PATENT DOCUMENTS

| | | | |
|---|---|---|---|
| 5,303,183 A | 4/1994 | Asakura | 365/149 |
| 5,592,410 A | 1/1997 | Verhaeghe et al. | 365/145 |
| 5,815,430 A | 9/1998 | Verhaeghe et al. | 365/145 |
| 5,903,492 A | 5/1999 | Takashima | 365/145 |
| 5,991,189 A * | 11/1999 | Miwa | 365/145 |
| 6,031,753 A * | 2/2000 | Kang et al. | 365/145 |
| 6,031,754 A | 2/2000 | Derbenwick et al. | 365/145 |
| 6,058,049 A * | 5/2000 | Kye et al. | 365/145 |
| 6,198,653 B1 * | 3/2001 | Tanaka | 365/145 |
| 6,233,170 B1 * | 5/2001 | Yamada | 365/145 |

FOREIGN PATENT DOCUMENTS

| | | |
|---|---|---|
| JP | 5-114741 | 5/1993 |
| JP | 11-177036 | 7/1999 |
| JP | 11-238387 | 8/1999 |

OTHER PUBLICATIONS

Search Report from European Patent Office for EP 01111108.5-2210.

Chung, Y. et al., "A 3.3–V 4–Mb Nonvolatile Ferroelectric RAM with a Selectively–Driven Double–Pulsed Plate Read/W rite–Back Scheme", Symposium on VLSI Circuits Digest of Technical Papers (1999).

* cited by examiner

*Primary Examiner*—Richard Elms
*Assistant Examiner*—Anh Phung
(74) *Attorney, Agent, or Firm*—Finnegan, Henderson, Farabow, Garrett & Dunner, L.L.P.

(57) ABSTRACT

A ferroelectric memory cap of sufficiently reading information on remnant polarization. The ferroelectric memory comprises: a memory cell array wherein memory cells, each of which comprises a ferroelectric capacitor and a transistor, are arranged and wherein word lines for selecting the memory cells, plate lines for applying a driving voltage to one end of the ferroelectric capacitor, and bit lines, to which the other end of the ferroelectric capacitor is selectively connected, are provided; and a sense amplifier for detecting and amplifying a signal which is read out from the ferroelectric capacitor to the bit line, and further comprises a bit line voltage control circuit for dropping a voltage of a bit line, from which a signal is read out, by a coupling capacitor during a data reading operation before the sense amplifier circuit is operated.

12 Claims, 27 Drawing Sheets

SEMICONDUCTOR MEMORY DEVICE

CROSS REFERENCE TO RELATED APPLICATIONS

This application claims benefit of priority under 35USC §119 to Japanese Patent Application No. 2000-137098, filed on May 10, 2000, the contents of which are incorporated by reference herein.

BACKGROUND OF THE INVENTION

1. Field of The Invention

The present invention relates generally to a semiconductor memory device. More specifically, the invention relates to a ferroelectric memory for storing data in a nonvolatile manner using a memory cell comprising a ferroelectric capacitor and a transistor.

2. Description of Related Art

At present, semiconductor memories are utilized in many fields, such as main memories of large computers, personal computers, various appliances and portable telephones. As semiconductor memories, volatile DRAMS and SRAMs, and non-volatile mask ROMs and EEPROMs are on the market. In particular, DRMMs are excellent in respect of low costs and high speed performance in spite of the volatile, and occupy most of the memory market. EEPROM flash memories, which are electrically rewritable non-volatile memories, are not on the market as much as DRAMs since there are disadvantages in that the number of rewriting operations are limited to about $10^6$, that a writing time of micro seconds is required and that a high voltage is required for carrying out a writing operation.

On the other hand, ferroelectric memories (ferroelectric RAMs) using ferroelectric capacitors are widely noticed as non-volatile memories having high speed performance since they were proposed in 1980. That is, ferroelectric memories have advantages in that they store binary data in a nonvolatile manner in accordance with the magnitude of remnant polarization, that the number of rewriting operations is about $10^{12}$ and that the writing/reading time is substantially the same as that in DRAMs, so that there is some possibility that ferroelectric memories may change the semiconductor memory market. For that reason, manufacturers have competed with each other in developing ferroelectric memories, and 4-Mbit ferroelectric memories have been presented in societies.

FIG. 35 shows the circuit construction of a conventional ferroelectric memory. Similar to DRAMs, a memory cell comprises an NMOS transistor and a ferroelectric capacitor connected thereto in series. This memory cell configuration is called the 1T1C configuration. The difference from DRAMs is that data are stored in a nonvolatile manner by utilizing the remnant polarization of the ferroelectric capacitor. Similar to DRAMs, the configuration of a cell array may also be a folded bit configuration shown in FIG. 35. Similar to DRAMs, the theoretical lower limit of the minimum cell size is $2F \times 4F = 8F^2$ assuming that the minimum working dimension is F.

FIG. 36 shows the operation waveform of a ferroelectric memory. In the stand-by state, bit lines BL and /BL are precharged to Vss, and plate lines PL0 and PL1 also have Vss. In the active state, the bit lines BL and /BL are first floated, an H level potential Vpp is applied to a selected word line WL, and the voltage of a selected plate line PL0 is raised from Vss to Vaa. The Vaa is a common power supply voltage in the array, and usually an external power supply voltage Vdd or a voltage dropping therefrom.

At this time, a voltage is applied to the ferroelectric capacitor of the selected cell using a bit line capacity CB as a load capacity, so that a signal charge is read out to the bit lines. The potential read out to the bit lines varies in accordance with "1" or "0" of cell data. When the data is "1", the inversion of polarization occurs, so that a large potential is generated in the bit lines. When the data is "0" the inversion of polarization does not occur, so that a small potential variation appears in the bit lines. In the case of the 1T1C configuration, a reference potential is set to be the intermediate potential between the bit line potential in the case of the data of "0" and bit line potential in the case of the data of "1", to sense the data by means of a sense amplifier. That is, after the data is read out to the bit lines, a sense amplifier activating signal SEN is raised to H, so that the "1" data is amplified to Vaa and the "0" data is amplified to Vss.

The destructive reading of the "1" data is carried out in which the inversion of polarization occurs. In the cell of the "1" data, after the read data is sensed, the bit lines have Vaa, and the voltage between terminals of the ferroelectric capacitor is substantially zero. Thereafter, when the voltage of the plate line is returned to Vss, a voltage Vaa having the reversed polarity to the polarity during a reading operation is applied to the ferroelectric capacitor, so that the destructively read data "1" is rewritten. In the cell of the "0" data, the bit lines have Vss, so that the voltage Vaa is applied to the ferroelectric capacitor from the side of the plate line. When the voltage of the plate line is returned to Vss, the voltage between terminals of the ferroelectric capacitor is zero, the state of the memory returns to the original remnant polarization state. Thereafter, the level of the word line WL0 is lowered, and the voltage of the bit lines BL and /BL is returned to Vss, so that the state of the memory returns to the stand-by state.

FIGS. 39A and 39B show the locus of voltages applied to a ferroelectric capacitor during the reading and writing operations when Vaa=2.5 V, respectively. In FIGS. 39A and 39B, the positive axis of abscissas shows applied voltages when the potential of a plate-line-side terminal is positive, and the negative axis thereof shows applied voltages when the potential of a bit-line-side terminal is positive. The reading voltage to the bit line is derived as a voltage (on the basis of −2.5 V as a reference) at the intersection between the hysteresis curve of the ferroelectric capacitor and the straight load line of a bit line capacity CB, with respect to "0" and "1" data, respectively. The reason why this is obtained is that when the positions on Y-axis (the axis of the quantity of polarization) with respect to the start point of the locus of the ferroelectric capacitor and the start point of the straight load line are allowed to be coincident with each other, the charge outputted to the variation in polarization by applying a voltage to the ferroelectric capacitor is equal to the charge (CB×voltage) required to raise the bit line potential.

Specifically, in the example of FIGS. 39A and 39B, when CB=200 fF and Vaa=2.5 V, the charge read in the bit lines is about 1.5 V in the case of the "1" data and about 0.7 V in the case of the "0" data. In the case of the memory cell having the 1T1C configuration shown in FIG. 35, the intermediate value therebetween is set to be the reference voltage, the substantial signal quantity is 0.35 V. When a memory cell comprises two NMOS transistor and two ferroelectric capacitors (this will be hereinafter referred to as the 2T2C configuration), the signal quantity if 0.7 V.

Thus, in the ferroelectric memory, there is a problem in that the voltage applied to the ferroelectric capacitor is limited to the capacity ratio including the polarization of the ferroelectric capacitor to the bit line capacity. Specifically, in the example of FIG. 39, the voltage applied to the ferroelectric capacitor during reading is 2.5 V−1.5 V=1.0 V in the case of the "1" data. In the case of the "0" data, the voltage is 2.5 V−0.7 V=1.8 V. If the cell array power supply voltage Vaa is applied to the ferroelectric capacitor as it is, the difference in signal corresponding to the difference (2Pr=2× 200 fF) between the quantities of remnant polarization in the cases of the "1" and "0" data can be obtained. However, the bit line capacity CB is limited, only a voltage less than Vaa is applied to the ferroelectric capacitor. In other words, only a part of remnant polarization contributes to the signal.

On the other hand, in the case of a writing (rewriting) operation, if the capacity of the plate line is sufficiently large, the amplified voltage of the bit lines is applied to the ferroelectric capacitor as it is, so that substantially 100% of the power supply voltage Vaa is applied to the ferroelectric capacitor as shown in FIG. 39B. The fact that the voltage applied to the ferroelectric capacitor is low has the merits of having a small deterioration due to fatigue. However, the fatigue is determined by the writing (rewriting) operation in which the high voltage Vaa is applied (the fatigue specification of the ferroelectric memory is determined by the total number of cycles of reading/writing operations).

The above described problem is not practically a serious problem in a ferroelectric capacitor on standard conditions that the sufficient reading signal quantity shown in FIGS. 39A and 39B can be obtained. However, there is a serious problem (1) if the hysteresis characteristics of the respective cells vary, (2) if a deterioration due to depolarization is great, (3) if a decrease in signal due to an imprint is great, (4) if a deterioration due to fatigue is great, or (5) if the power supply voltage is lowered. The problem is particularly serious since the influence of the shift of the hysteresis curve due to the imprint is conspicuous when the value of Vaa—(anti-voltage after imprint) is low.

FIG. 40 shows the state of the deterioration of a signal when the power supply voltage Vaa drops from 3 V to 2.5 V. Assuming that the anti-voltage is Vc, the signal quantity greatly decreases due to the decrease of Vaa since the signal quantity is in proportion to Vaa−Vc. In addition thereto, as shown in the locus during the reading of the "1" data, the variation in polarization end decreases, so that the remnant polarization is not more effectively utilized.

As described above, when the bit line capacity CB is relatively small, the voltage applied to the ferroelectric capacitor during the reading of data is small. on the other hand, when the bit line capacity CB is sufficiently large, a high voltage is applied to the ferroelectric capacitor, but the reading signal quantity is small.

In addition to the above described problems, the conventional ferroelectric memory has disadvantages in that the size of the cell can not be smaller than that of a DRAM, that the resistance of the plate line increases since it is required to divide a plate line every word line, and that since it is required to arrange a plate line driving circuit at the pitch of word lines, it is not possible to obtain a sufficient driving capacity, the operation speed is lower than that of DRAMs. The inventors have proposed a ferroelectric memory capable of eliminating the above described disadvantages (Japanese Patent Application Nos. 8-147452 , 9-001115 , 9-153137, 9-346404, etc.).

FIG. 37 shows the construction of the above described ferroelectric memory. Each of memory cells comprises a parallel-connected circuit consisting of an NMOS transistor and a ferroelectric capacitor. The plurality of parallel-connected circuits are chain-connected in series to constitute a memory block. One end of the memory cell block is connected to bit lines via block selecting NMOS transistors, and the other end thereof is connected to plate lines. With this construction, there are advantages in that (1) it is possible to obtain a small unit memory size of $4F^2$, (2) a plane transistor capable of being easily produced is used, (3) it is possible to carry out a general purpose random access, and (4) it is possible to carry out a rapid reading/writing operation.

FIG. 38 shows the operation waveform of such a ferroelectric memory. In a stand-by state, all of the word lines are held so as to have a H level, a block selecting signal is held so as to have a L level, and both ends of the ferroelectric capacitor are short-circuited to stably hold data. In an active state, a selected word line, e.g., WL0, is set so as to have a L level, the bit line precharged to Vss is set so as to be floating, a block selecting signal, e.g., BS0, is set so as to have a H level, and Vaa is applied to a selected plate line PL0. Thus, a voltage is applied to a ferroelectric capacitor of a memory cell which is selected in the same manner as that in usual ferroelectric capacitors, so that a reading operation is carried out. The transistors of unselected memory cells in a selected block remain being turned on, so that no voltage is applied to the ferroelectric capacitor, thereby holding data. However, the basic operation of this ferroelectric memory is the same as that of the conventional ferroelectric memory, the problem in that a sufficient voltage is not applied to a ferroelectric capacitor during a reading operation remains.

As described above, in the conventional ferroelectric memory, there is a problem in that a sufficient voltage is not applied to a ferroelectric capacitor during a reading operation as compared with a writing operation, so that accumulated information on remnant polarization is not sufficiently read, thereby causing a reading signal quantity to be small. In particular, when an operation is carried out at a low voltage, this problem is serious, and the deterioration of a signal due to an imprint is conspicuous.

SUMMARY OF THE INVENTION

It is therefore an object of the present invention to eliminate the aforementioned problems and to provide a ferroelectric memory capable of sufficiently reading information on remnant polarization.

In order to accomplish the aforementioned and other objects, according to one aspect of the present invention, a semiconductor memory device comprises: a memory cell array wherein memory cells, each of which comprises a ferroelectric capacitor and a transistor, are arranged and wherein word lines for selecting the memory cells, plate lines for applying a driving voltage to one end of the ferroelectric capacitor, and bit lines, to which the other end of the ferroelectric capacitor is selectively connected, are provided; a sense amplifier for detecting and amplifying a signal which is read out from the ferroelectric capacitor to the bit line; and a bit line voltage control circuit, connected to the bit lines, for dropping a voltage of a bit line, from which a signal is read out, during a data reading operation before the sense amplifier circuit is operated.

According to the present invention, the voltage applied to the ferroelectric capacitor is raised during a data reading operation by dropping a bit line voltage during the data reading operation, so that it is possible to effectively read information on remnant polarization. Specifically, according to the present invention, the bit line voltage control has at least one capacitor for dropping the voltage of the bit line by a capacitive coupling to the bit line. Alternatively, the bit line voltage control circuit has a pair of capacitors, each of which is provided in a corresponding one of a pair of bit lines and each of which is driven so as to be connected to a selected bit line of the pair of capacitors.

More specifically, the above described bit line voltage control circuit may have any one of the following constructions.

(a) The bit line voltage control circuit may have a pair of capacitors, each of which is provided in a corresponding one of a pair of bit lines, a first terminal of each of the pair of capacitors being connected to a corresponding one of the pair of bit lines, and a second terminal of each of the pair of capacitors being connected to a corresponding one of a pair of driving signal lines, a first potential being applied to the pair of driving signal lines before a data reading operation, and a second potential which is lower than the first potential being applied to one of the pair of driving signal lines during the data reading operation.

(b) The bit line voltage control circuit may have first and second transistors, the drain of each of the first and second transistors being connected to a pair of bit lines, and a capacitor, one end of which is connected to the sources of the first and second transistors and the other end of which is connected to a driving signal line, a first potential being applied to the driving signal line and the first and second transistors being turned on before a data reading operation, and one of the first and second transistors on the side of an unselected bit line being turned off and a second potential which is lower than the first potential being applied to the driving signal line during the data reading operation.

(c) The bit line voltage control circuit may have a first transistor, the drain of which is connected to the bit line, a capacitor, one end of which is connected to the source of the first transistor and the other end of which is connected to a driving signal line, and a second transistor which is provided between a connection node of the first transistor to the capacitor and a power supply line of a first potential, a second potential which is higher than the first potential being applied to the driving signal line, the first transistor being turned off and the second transistor being turned on before a data reading operation, and the second transistor being turned off and the first transistor being turned on to apply a third potential, which is lower than the second potential, to the driving signal line during the data reading operation.

The coupling capacitor for use in each of the above described bit line voltage control circuits preferably has a capacity which is 10% or more as large as the capacity of the bit line.

According to another aspect of the present invention, a semiconductor memory device comprises:

a memory cell array wherein memory cells, each of which comprises a ferroelectric capacitor and a transistor, are arranged and wherein word lines for selecting the memory cells, plate lines for applying a driving voltage to one end of the ferroelectric capacitor, and bit lines, to which the other end of the ferroelectric capacitor is selectively connected, are provided; a sense amplifier for detecting and amplifying a signal which is read out from the ferroelectric capacitor to the bit line; and a plate line driving circuit for applying a voltage, which has a greater amplitude than an amplitude voltage of the bit line, to the plate line during a data reading operation before the sense amplifier circuit is operated.

Thus, by applying the great amplitude voltage to the plate line during the data reading operation, the voltage applied to the ferroelectric capacitor during the data reading operation can be raised similar to the case where the voltage of the bit line is dropped, so that it is possible to effectively read information on remnant polarization.

In this case, the plate line driving circuit preferably applies a voltage, which has the same amplitude as the amplitude voltage of the bit line, to the plate line when the sense amplitude circuit is operated. For example, the plate line driving circuit may comprise: a resetting transistor for resetting the plate line at a reference voltage; a first driving transistor for selectively applying a voltage, which has the same amplitude as the amplitude voltage of the bit line, to the plate line; and a second driving transistor for selectively applying a voltage, which has a greater amplitude than the amplitude voltage of the bit line, to the plate line.

Alternatively, the plate line driving circuit may comprise: a capacitor, one end of which is connected to the plate line; a resetting transistor for resetting the plate line at a reference voltage; a precharging transistor for precharging a voltage, which has the same amplitude as the amplitude voltage of the bit line, to the capacitor; and a booster driving circuit for selectively driving the other end of the capacitor to apply a voltage, which has a greater amplitude than the amplitude voltage of the bit line, to the plate line.

The memory cell array of the semiconductor memory device, to which the present invention is applied, may have a unit memory cell comprising a ferroelectric capacitor and a transistor connected to the ferroelectric capacitor in series, or may form a memory block wherein a plurality of circuits, each of which comprises a ferroelectric capacitor and a transistor connected thereto in parallel, are connected in series between the bit line and the plate line.

BRIEF DESCRIPTION OF THE DRAWINGS

The present invention will be understood more fully from the detailed description given herebelow and from the accompanying drawings of the preferred embodiments of the invention. However, the drawings are not intended to imply limitation of the invention to a specific embodiment, but are for explanation and understanding only.

In the drawings.

DESCRIPTION OF THE PREFERRED EMBODIMENTS

Referring now to the accompanying drawings, the preferred embodiments of the present invention will be described below.

Figure 1A:
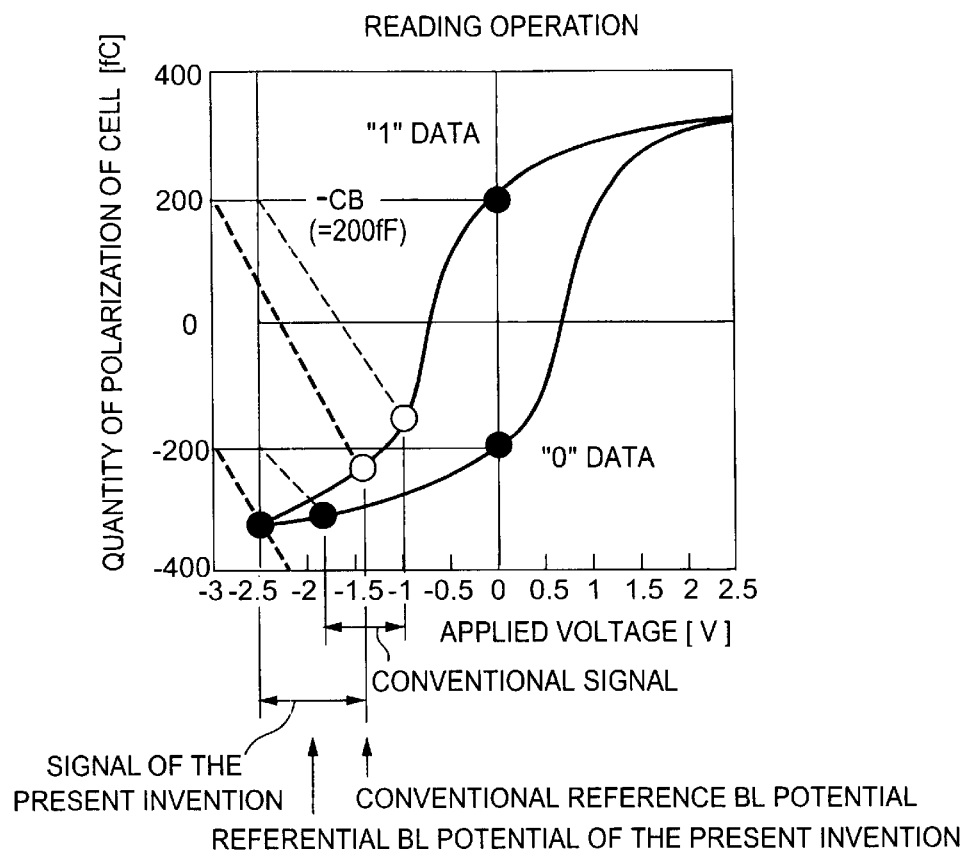
FIGS. 1A and 1B are graphs showing the locus of voltages applied to a ferroelectric capacitor of a ferroelectric memory according to the present invention during reading and writing operations, respectively.
Figure 1B:
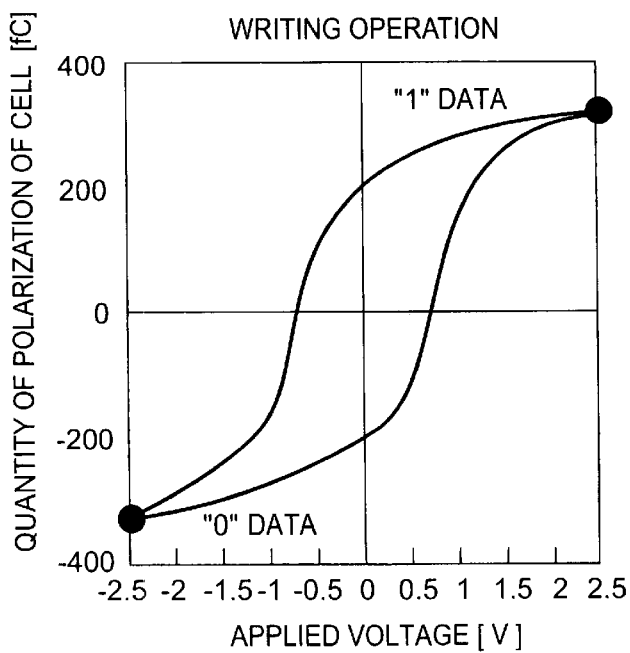
Figure 39A:
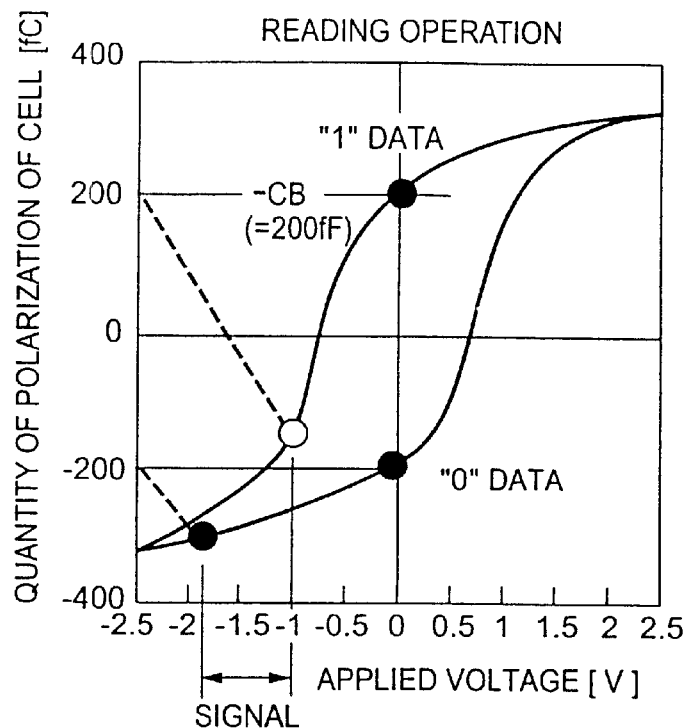
FIGS. 39A and 39B show the locus of voltages applied to a ferroelectric capacitor of a ferroelectric memory during reading and writing operations, respectively.
Figure 39B:
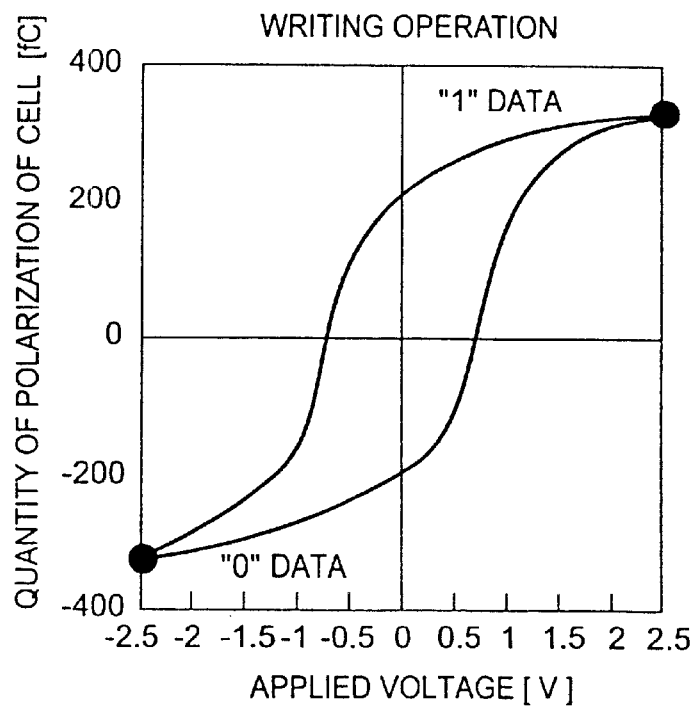
Figure 40:
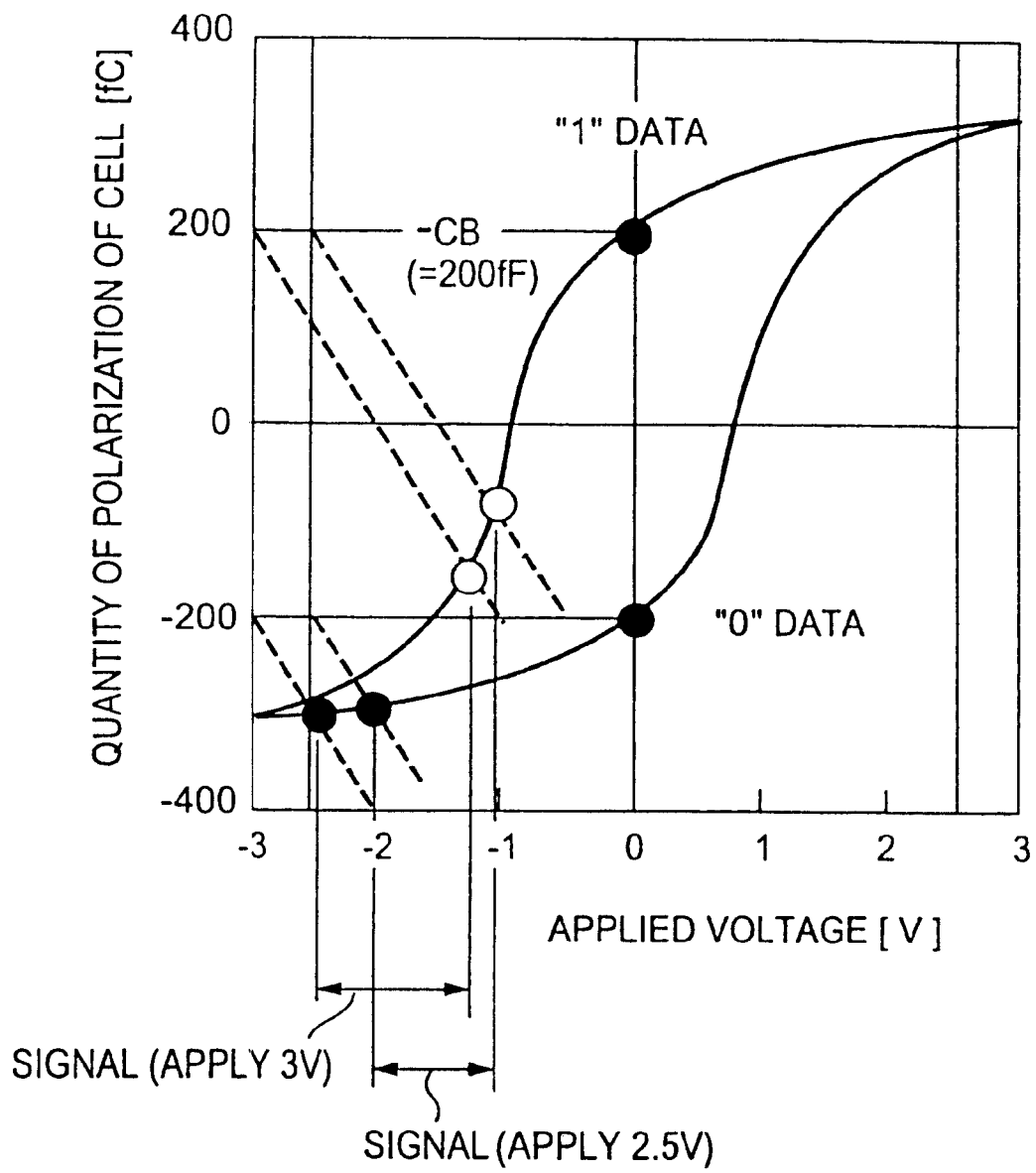
FIG. 40 is a graph showing the state of the deterioration of a signal in a conventional ferroelectric memory.

FIGS. 1A and 1B show the locus of applied voltages on a hysteresis curve in a ferroelectric memory of a system according to the present invention during reading and writing operations, so as to overlap with the locus in the case of the conventional system shown in FIG. 39. In a ferroelectric memory of a plate line driving system, when a bit line amplitude is 2.5 V, when a "1" data is written (rewritten), a bit line voltage is BL=2.5 V and a plate line voltage is PL=0V, so that a voltage of 2.5 V is applied to a ferroelectric capacitor as shown in FIG. 1B. When a "0" data is written (rewritten), BL=0V and PL=2.5 V, so that a voltage is applied to the ferroelectric capacitor although it is a reverse voltage to that when the "1" data is written. This writing (rewriting) operation is the same as that in the conventional system.

On the other hand, during a reading operation unlike the writing operation, a higher plate line voltage of 3 V than 2.5 V in the conventional system is applied as shown in FIG. 1A. That is, when the "1" data is read, a voltage of 3 V is applied to the ferroelectric capacitor, so that the bit line voltage rises by a capacity ratio of the capacity of the ferroelectric capacitor (remnant polarization component+paraelectric capacity component) to the bit line capacity CB. This becomes a "1" reading signal. Similarly, when the "0" data is read, a voltage of 3 V is applied to the ferroelectric capacitor, so that the bit line voltage rises by a capacity ratio of the capacity of the ferroelectric capacitor to the bit line capacity CB. This becomes a "0" reading signal.

Similarly, in the system of the present invention, a higher voltage than that in the conventional system is applied to the ferroelectric capacitor. As a result, the reading signal quantity is larger than that in the conventional system. Specifically, the conventional system will be compared with the system of the present invention when the bit line capacity is CB=200 fF. As described above, in the conventional system wherein the voltage applied to the ferroelectric capacitor is 2.5 V, the signal voltage read out to the bit line in the case of the "1" data is about 1.5 V, and the signal voltage read out to the bit line in the case of the "0" data is about 0.8 V. In the case of the memory cell having the 1T1C configuration, the intermediate voltage therebetween is the reference voltage, so that the substantial signal quantity is 0.35 V. In the case of the 2T2C configuration, the signal quantity is 0.7 V.

On the other hand, in the system of the present invention wherein the voltage applied to the ferroelectric capacitor is 3 V, as shown in FIG. 1A, the voltage read out to the bit line in the case of the "1" data is about 1 V, and the voltage read out to the bit line in the case of the "0" data is substantially 0 V. In the case of the memory cell having the 1T1C configuration, the intermediate voltage therebetween is the reference voltage, so that the substantial signal quantity is 0.5 V, and in the case of the 2T2C configuration, the signal quantity is 1 V.

As described above, the point of the present invention is that during the reading of data, the voltage applied to the ferroelectric capacitor is increased to obtain a large signal quantity. Even if the applied voltage during the reading operation is thus increased, the voltage between the terminals of the ferroelectric capacitor immediately before sensing data is 1.4 V in the case of the "1" data and 2.5 V in the case of the "0" data, so that it does not exceed the voltage during the writing operation. The specification of the number of reading/writing cycles of the ferroelectric memory is determined by the sum of the number of reading operations and the number of writing operations, and the deterioration of reliability is substantially determined by the writing operations. This is the same as that in the conventional system. The effect of the increase of the reading signal quantity is particularly effective in a low voltage operation in which the voltage is difficult to be applied to the ferroelectric capacitor. This effect is also effective when the hysteresis of the ferroelectric capacitor is shifted by an imprint to the left in FIG. 1A so that the voltage is difficult to be applied to the ferroelectric capacitor. In either case, the voltage between the plate line and the bit line substantially decreases, so that the system of the present invention wherein the plate line voltage is raised during the reading operation is more effective.

The preferred embodiments of the present invention will be described below.

(First Preferred Embodiment)

Figure 2:
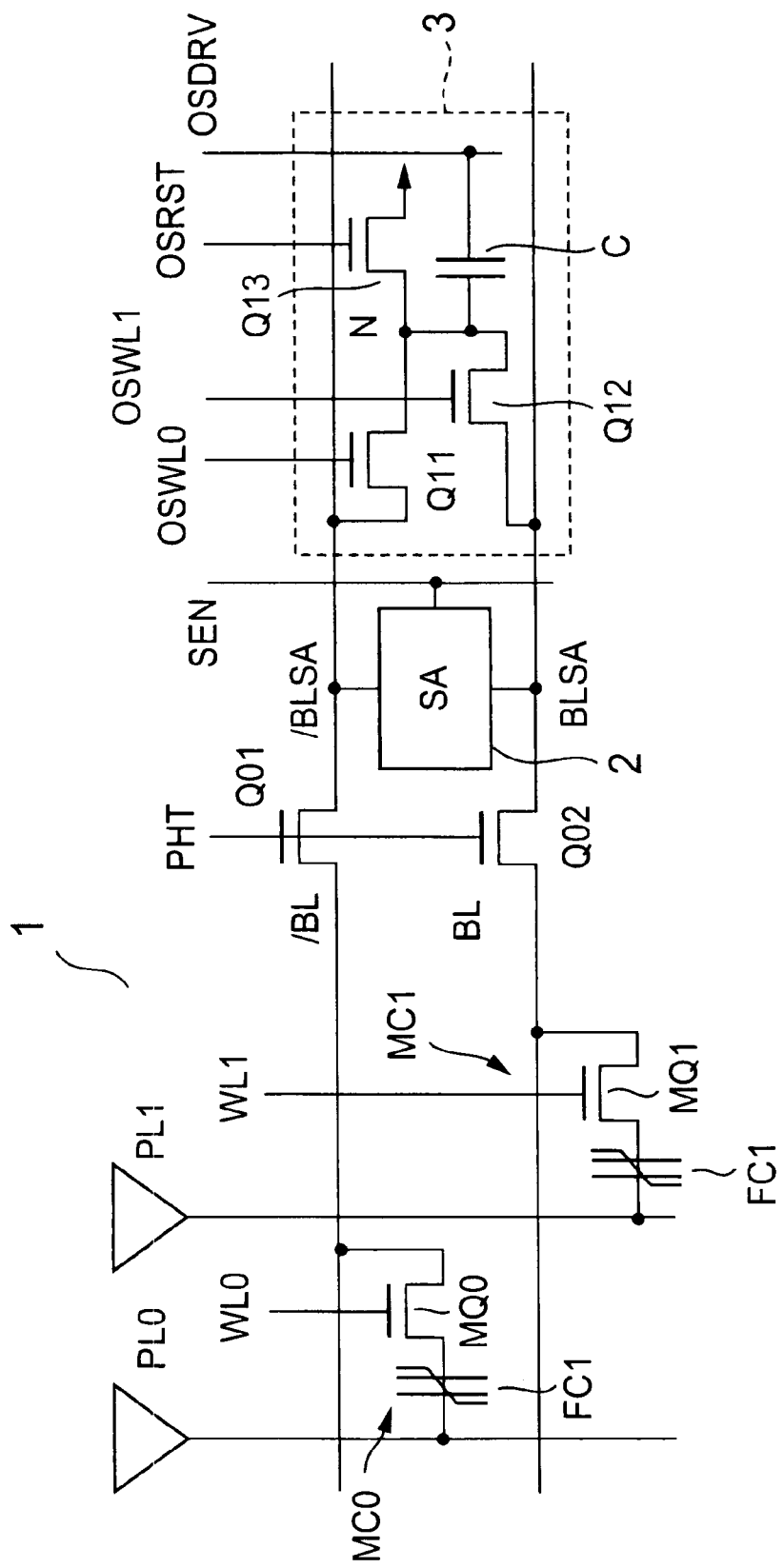
FIG. 2 is a circuit diagram showing the circuit construction of the first preferred embodiment of a ferroelectric memory according to the present invention.

FIG. 2 shows the circuit construction of the first preferred embodiment of a ferroelectric memory according to the present invention. In this embodiment, a memory cell array 1 has the 1T1C configuration. This figure shows memory cells MC0 and MC1 which are connected to a pair of bit lines BL and /BL, respectively. One ends of ferroelectric capacitors FC0 and FC1 are connected to plate lines PL0 and PL1, respectively, and the other ends thereof are connected to the bit lines /BL and BL via NMOS transistors MQ0 and MQ1, respectively. The gates of the NMOS transistors MQ0 and MQ1 are connected to word lines WL0 and WL, respectively.

The pair of bit lines BL and /BL are connected to a sense amplifier circuit (SA) 2 via selecting NMOS transistors Q01 and Q02, respectively. However, the selecting NMOS transistors Q01 and Q02 are required in the case of a common sense amplifier system, so that these transistors are not required in a system other than the common sense amplifier system.

Sense nodes BLSA and /BLSA of the sense amplifier circuit 2 are provided with a bit line voltage control circuit 3 for controlling a bit line voltage during the reading of data. The bit line voltage control circuit 3 has a coupling capacitor C (capacity C), connected to a selected bit line during a reading operation, for dropping the potential thereof, and NMOS transistors Q11 and Q12 for selectively connecting one end N of the capacitor C to the sense nodes /BLSA and BLSA. The other end of the capacitor C is connected to a control signal line CSDRV.

The NMOS transistors Q11 and Q12 are controlled by control signal lines OSWL0 and OSWL1. The node N of the capacitor C is also provided with a resetting NMOS transistor Q13 for resetting the node N. The capacity C of the capacitor C is equal to or higher than 10% of a bit line capacity CB. This condition is the same in all of preferred embodiments which will be described later.

Figure 3:
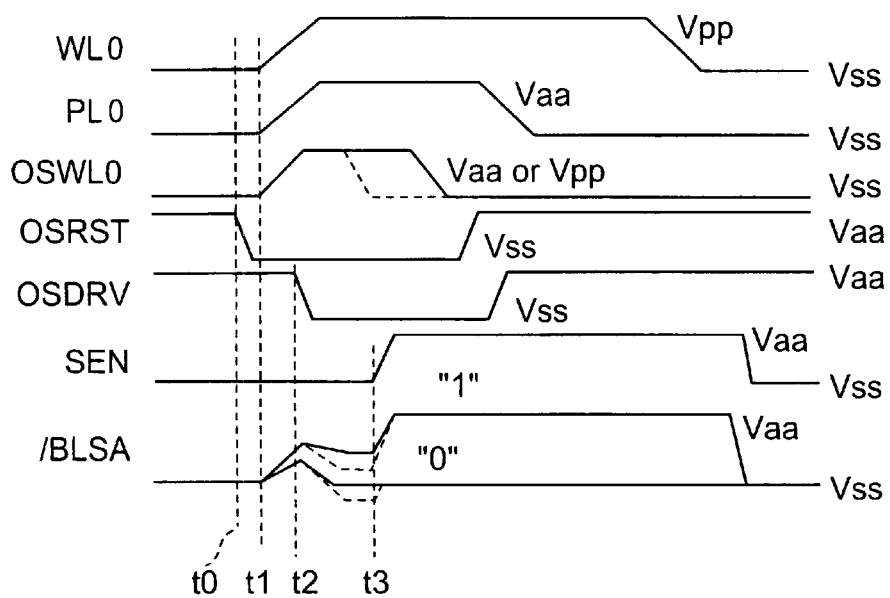
FIG. 3 is a waveform illustration showing the operation of the ferroelectric memory in the first preferred embodiment.

FIG. 3 shows the operation waveform of a ferroelectric memory in this preferred embodiment. This operation waveform is an operation waveform when the word line WL0 and the plate line PL0 are selected to read and write data from and in the memory cell MC0.

In a stand-by state, a reset signal line OSRST has an "H" level (=Vaa), a driving signal line OSDRV has an "H" level (=Vaa), and control signal lines OSWL0 and OSWL1 have an "L" level (=Vss). Thus, in the bit line voltage control circuit 3, the voltage of the node N is held to be 0 V, so that a charge of Vaa·is charged to the capacitor C.

When the level of the reset signal OSRST is dropped to an "L" level and a resetting transistor Q13 is turned of f, an active operation is started. Substantially simultaneously, the level of the selected word line WL0 is raised to an "H" level (=Vpp), the level of the selected plate line PL0 is raised to the "H" level (=Vaa), and the level of the control signal line OSWL0 is raised to the "H" level (=Vaa or Vpp) (time t1). Thus, the transistor Q11 is turned on, so that the node N of the capacitor C is connected to the sense node /BLSB, thus the bit line /BL, in which a selected data is read out. Slightly thereafter, the level of the driving signal line OSDRV is dropped to the "L" level (time t2).

When the resetting transistor Q13 is turned off and the driving signal line OCDRV is set to be a reference voltage (0 V), the voltage of the node N is −Vaa. Since this node N is connected to the bit line /BL in which the selected cell data is read out, the voltage rise of the bit line /BL (capacity CB) having being precharged to the Vss is started due to the reading of data, and immediately thereafter, the voltage is dropped due to the capacitor C. As an another method, the reading of data to the bit line and the dropping of the bit line voltage due to the capacitor C may be carried out at the same timing.

In other words, the above described connection of the capacitor C to the bit line at the beginning of the reading is an operation equivalent to that when the bit line capacity is substantially CB+C which is precharged to −C·Vaa/(CB+C).

Therefore, the voltage between the selected plate line PL0 and the bit line /BL is Vaa+C·Vaa/(CB+C). That is, the voltage applied to the selected ferroelectric capacitor is higher than that in the conventional system by C·Vaa/(CB+C).

After a data signal is read out to the bit line, a sense amplifier activating signal SEN is raised to the "H" level, and the reading signal is amplified by a sense amplifier 2 (time t3). Thereafter, the level of the plate line PL0 is returned to the "L" level to carry out a rewriting operation. Before the level of the plate line PL0 is returned to the "L" level, about during a sense operation, the level of the control signal line OSWL0 is returned to the "L" level, and the capacitor C is disconnected from the bit line, so that the levels of the reset signal line OSRST and the precharging signal line OSDRV are raised to the "H" level, thereby returning to a precharging state.

As described above, according to this preferred embodiment, when the voltage is applied to the plate line by the bit line voltage control circuit 3 to read data, the voltage of the bit line from which the data is read out is forced to be dropped. Thus, a higher voltage than that in the conventional system is applied to the ferroelectric capacitor from which data is read out, so that accumulated remnant polarization can be effectively read. The voltage applied to the ferroelectric capacitor does not exceed the Vaa, so that reliability is ensured. According to the present invention, the amplitude of the voltage of the bit line before the driving of the sense amplifier during the reading operation is smaller than the amplitude of the voltage of the plate line. Specifically, if Vaa=2.5 V and the capacity C of the capacitor C is about $\frac{1}{10}$ as large as the bit line capacity CB, the amplitude of the voltage of the bit line is smaller than the amplitude of the voltage of the plate line by about 0.3 V.

In this preferred embodiment, if the capacitor C is connected to the selected bit line, the bit line capacity increases, so that it seems that the amplitude of the signal of the bit line decreases. However, with respect to the influence of the increase of the bit line capacity, as can be clearly seen from FIG. 1A, the influence of the increase of the voltage applied to the ferroelectric capacitor is larger than the influence of the increase of the gradient of the capacity CB shown by a thick broken line, so that the signal quantity substantially increases.

The reason for this is that the signal quantity is in proportion to (voltage between plate line and bit line)–(antivoltage) except for a case where the bit line capacity CB is far greater than the capacity of the ferroelectric capacitor, so that the influence of the increase of the applied voltage is large.

According to this preferred embodiment, the following effects can be further obtained.

① A potential of higher than the Vaa is not applied to the bit line, the plate line and the sense amplifier circuit although the voltage between the plate line and the bit line is higher than the Vaa. Therefore, this is advantageous to withstand voltage of transistors and so forth.

② If the capacitor C of the bit line voltage control circuit 3 requires a large area, this is shared by the pair of bit lines BL and /BL, so that the capacitor C can be connected to any one of the bit lines. Therefore, the influence of the increase of the area occupied by the chip is relatively small.

③ In the case of the 1T1C configuration, it is required to generate the intermediate potential between the "0" data and the "1" data as the reference potential, so that it is required to provide a dummy cell having a relatively large area (e.g., a dummy cell using a ferroelectric capacitor having a large variation, or a dummy cell using a MOS capacitor). On the other hand, according to the present invention, since the bit line voltage on the side of reading is dropped, the reference potential can be lowered, and the area of the dummy cell can be decreased. Furthermore, although it seems that the addition of the capacitor C of the bit line voltage control circuit 3 is substantially equivalent to the increase of the area of the dummy cell, it is never equivalent thereto since it is required to greatly increase the area of the dummy cell in order to actually slightly raise the reference potential. That is, it is effective that the system of the invention drops the bit line voltage on the side of reading and decreases the area of the dummy cell to apply a low voltage to the reference bit line.

④ If the area of the capacitor C of the bit line voltage control circuit 3 is increased to lower the bit line voltage, the voltage of the sense node /BLSA of FIG. 3 can be varied. At this time, the reference bit voltage can be set to be substantially 0 V. In this case, the dummy cell can be omitted.

(Second Preferred Embodiment)

Figure 4:
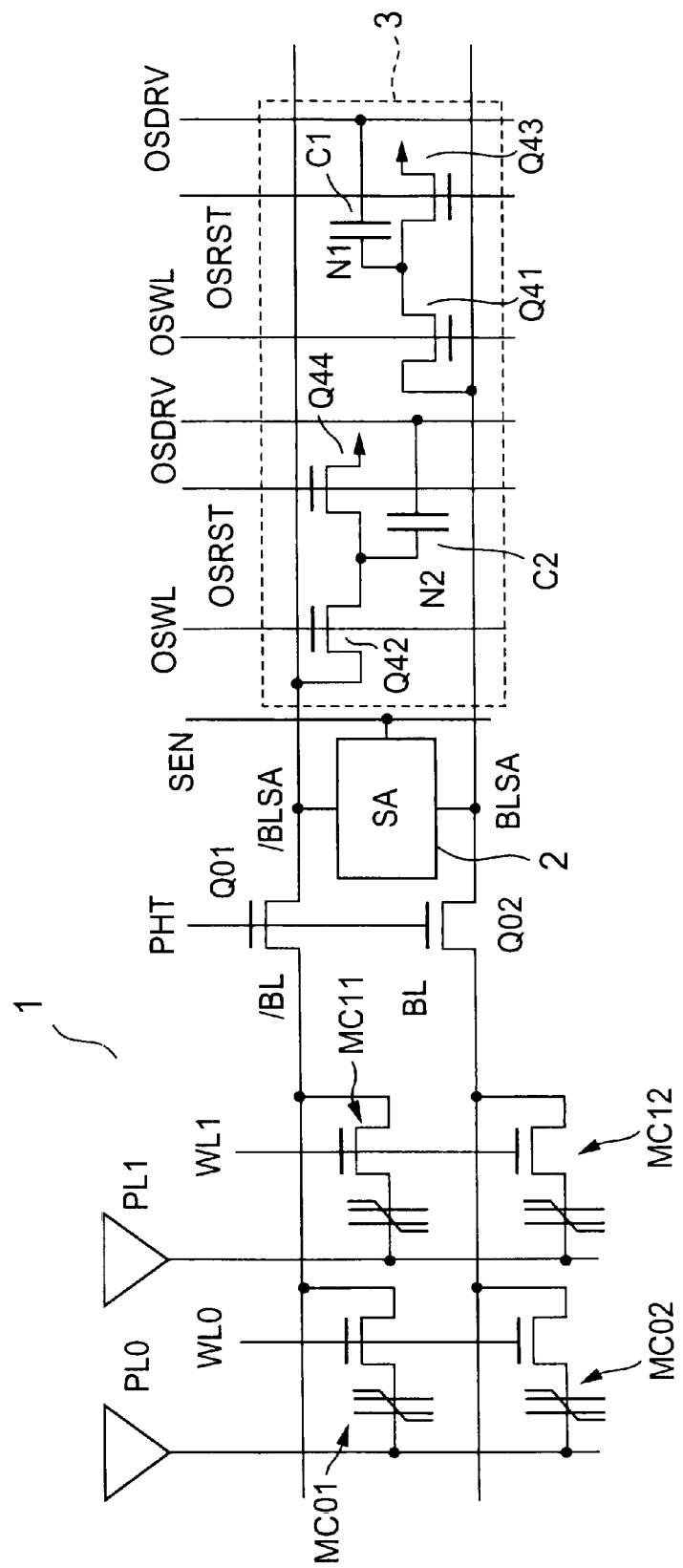
FIG. 4 is a circuit diagram showing the circuit construction of the second preferred embodiment of a ferroelectric memory according to the present invention.

FIG. 4 shows the circuit construction of the second preferred embodiment of a ferroelectric memory according to the present invention. In this embodiment, a memory cell array 1 has the 2T2C configuration. This figure shows a pair of memory cells MC01 and MC02 which are arranged along a word line WL0, and a pair of memory cells MC11 and MC12 which are arranged along another word line WL1. The gates of NMOS transistors of the memory cells MCO1 and MCDO2 are commonly driven by the word line WL0, and the plate terminals of the ferroelectric capacitor are also commonly driven by a plate line PL0. Similarly with respect to the memory cells MC11 and MC12, they are commonly driven by the word line WL1 and a plate line PL1.

In the case of the 2T2C configuration, inverted data are stored in a pair of memory cells provided in the pair of bit lines and simultaneously read out. For that reason, the bit line voltage control circuit 3 is provided with capacitive-coupling capacitors C1 and C2 on the sides of the respective bit lines BL and /BL, respectively. The nodes N1 and N2 of the capacitors C1 and C2 are connected to sense nodes BLSA and /BLSA via NMOS transistors Q41 and Q42, respectively. The transistors Q41 and Q42 are simultaneously on-off-controlled by the same control signal line OSWL. The nodes N1 and N2 are provided with resetting NMOS transistors Q43 and Q44, respectively. These transistors are also simultaneously on-off-controlled by the same control signal line OSRST. Moreover, the reference terminals of the capacitor C1 and C1 are similarly driven by a common driving signal line OSDRV. The capacity ratios of the capacitors C1 and C2 to the bit lines are preferably the same as that in the first preferred embodiment.

Figure 5:
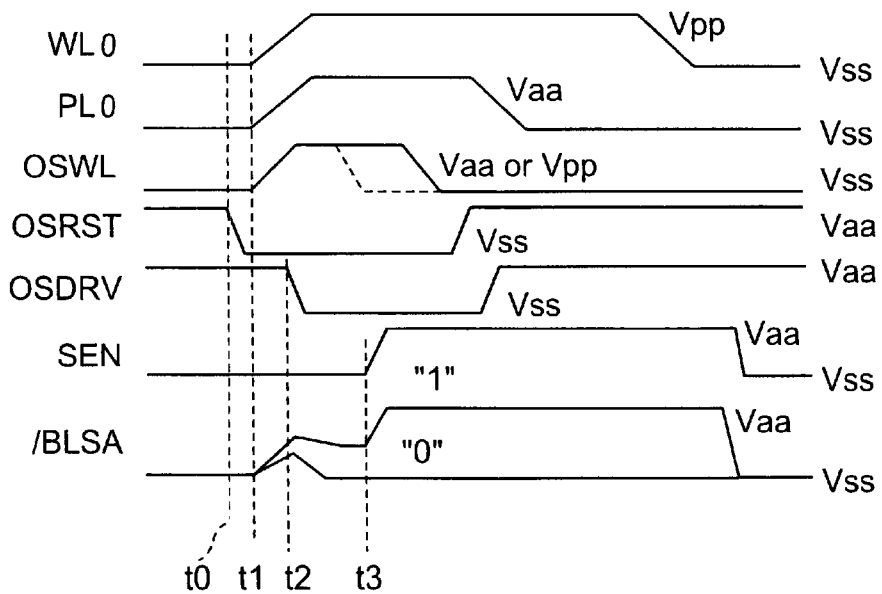
FIG. 5 is a waveform illustration showing the operation of the ferroelectric memory in the second preferred embodiment.

FIG. 5 shows the operation waveform of a ferroelectric memory in the second preferred embodiment. This operation waveform is an operation waveform when the word line WL0 and the plate line PL0 are selected to read and rewrite data from and in the memory cells MC01 and MC02. In a stand-by state, a reset signal line OSRST has an "H" level (=Vaa), a driving signal line OSDRV has an "H" level (=Vaa), and a control signal line OSWL has an "L" level (=Vss). Thus, in the bit line voltage control circuit 3, Vaa is charged to the capacitors C1 and C2.

After the level of the reset signal OSRST is dropped to an "L" level and resetting transistors Q43 and Q44 are turned off (t0), an active operation is started. Then, the level of the selected word line WL0 is raised to an "H" level (=Vpp), and the level of the selected plate line PL0 is raised to the "H" level (=Vaa) (t2). Simultaneously, the level of the control signal line OSWL is raised to the "H" level (=Vaa or Vpp). Thus, the transistors Q41 and Q42 are turned on, so that the nodes N1 and N2 of the capacitors C1 and C2 are connected to the sense nodes BLSA and /BLSA, thus the bit lines BL and /BL, respectively. Then, the level of the driving signal line OSDRV is dropped to the "L" level (t3) to drop the voltage of the bit line from which a signal is read out by the negative voltage of the capacitors C1 and C2.

Thus, similar to the first preferred embodiment, a higher voltage than that in the conventional system is applied to the ferroelectric capacitors of the memory cells MC01 and MC02 from which data are simultaneously read out, so that it is possible to obtain a large reading signal quantity.
(Third Preferred Embodiment)

Figure 6:
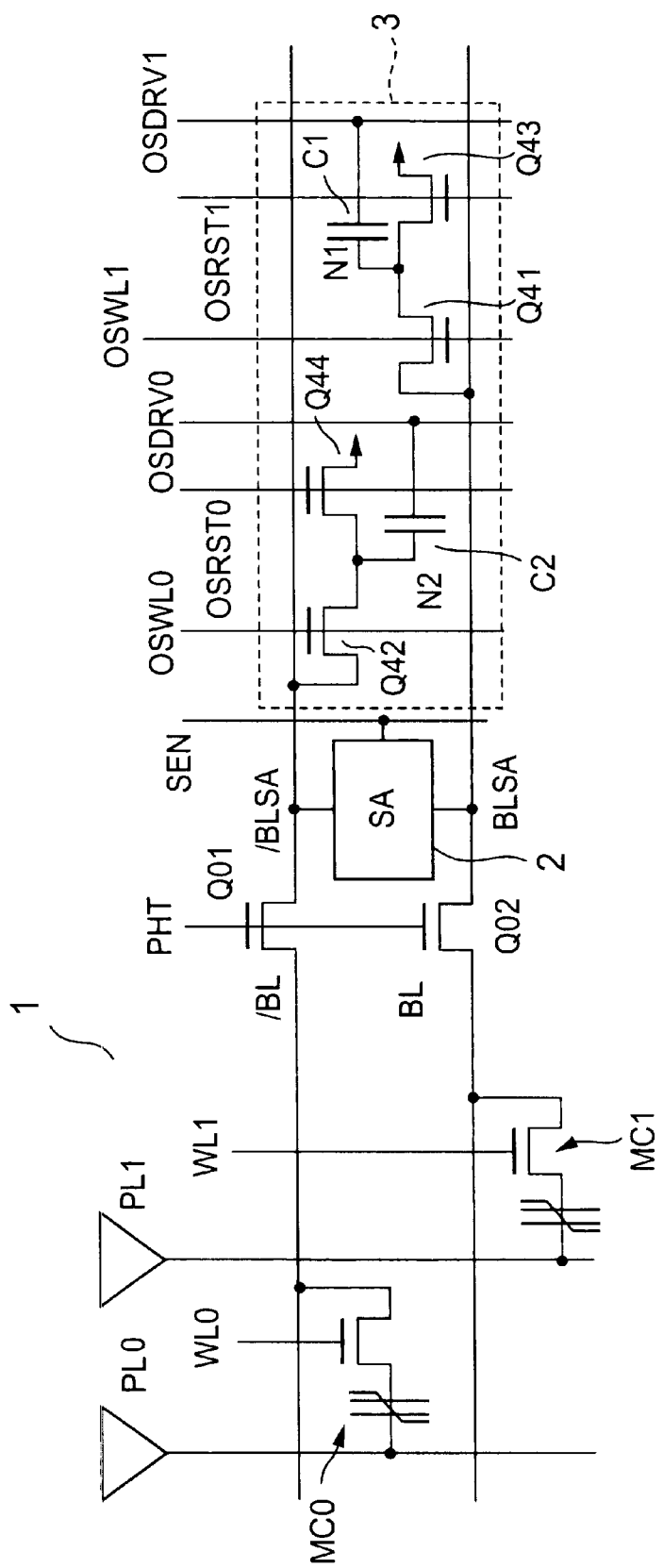
FIG. 6 is a circuit diagram showing the circuit construction of the third preferred embodiment of a ferroelectric memory according to the present invention.

FIG. 6 shows the circuit construction of the third preferred embodiment of a ferroelectric memory according to the present invention. In this embodiment, a memory cell array 1 has the 1T1C configuration similar to the first preferred embodiment shown in FIG. 2. On the other hand, the construction of a bit line voltage control circuit 3 is different from that in FIG. 2, and is the same as that in the second preferred embodiment shown in FIG. 4. This is provided in order to allow the same operation as that in the 2T2C configuration by simultaneously selecting word lines, simultaneously selecting plate lines PL0 and PL1, and simultaneously selecting two memory cells MC0 and MC1. The capacity ratios of capacitors C1 and C2 to the bit lines are preferably the same as that in the first preferred embodiment.

However, only one of the capacitors C1 and C2 is utilized during a reading operation when it is used as a 1T1C. Therefore, the control signal lines OSWL1 and OSWL0 of transistors Q41 and Q42 are separately prepared. The control signal lines OSRST1 and OSRST0 of resetting transistors Q43 and Q44, and driving signal lines OSDRV1 and OSDRV0 are also separately prepared.

Figure 7:
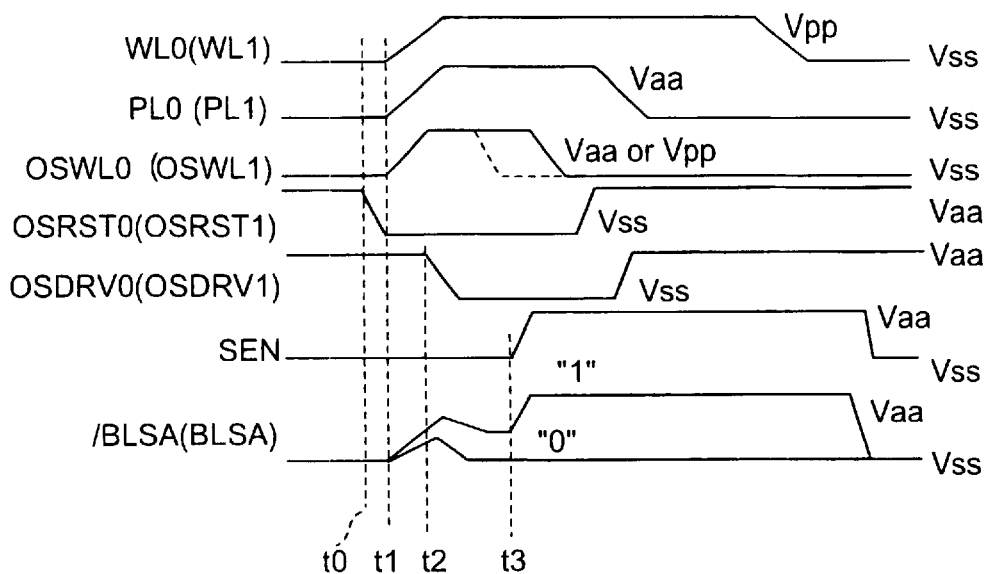
FIG. 7 is a waveform illustration showing the operation of the ferroelectric memory in the third preferred embodiment.

FIG. 7 shows the operation waveform of a ferroelectric memory in the third preferred embodiment. If it is operated as a 1T1C cell, when the word line WL0 and the plate line PL0 are selected, a control signal line OSWL0, a reset signal line OSRST0 and a driving signal line OSDRV0 are selected in synchronism therewith similar to the first preferred embodiment. At this time, the potential of a selected bit line /BL is dropped by the capacitor C2, and the capacitor C1 remains being in a precharge state. If it is operated as a 2T2C cell, the word lines WL0, WL1 and the plate lines PL0, PL1 are simultaneously selected as shown in parenthesis of FIG. 7. In accordance therewith, the respective control circuits of the bit line voltage control circuit 3 are simultaneously synchronous-controlled with respect to the two capacitors C1 and C2. Also according to this preferred embodiment, it is possible to obtain the same advantages as those in the first and second preferred embodiments.
(Fourth Preferred Embodiment)

Figure 8:
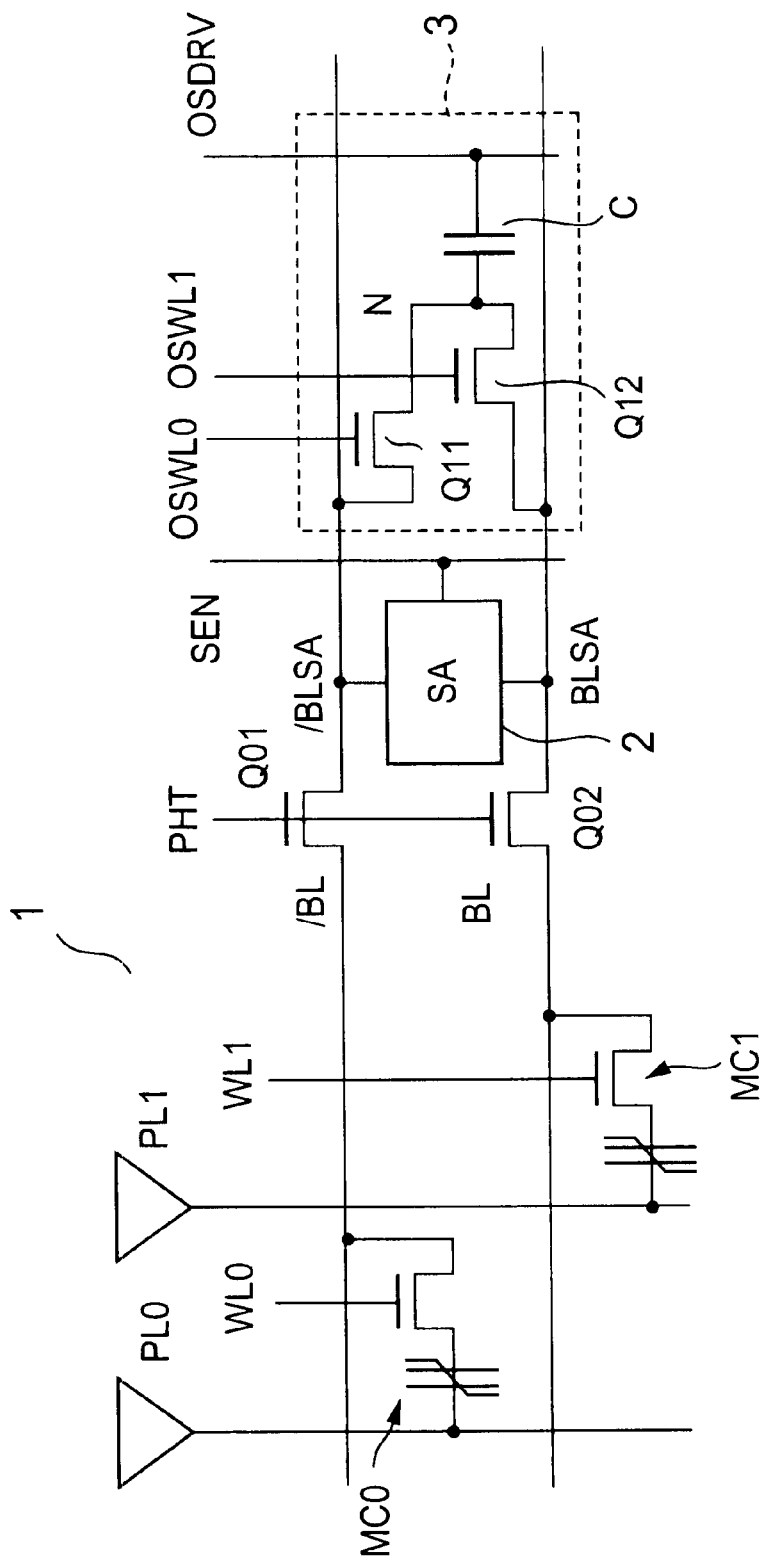
FIG. 8 is a circuit diagram showing the circuit construction of the fourth preferred embodiment of a ferroelectric memory according to the present invention.

FIG. 8 shows the circuit construction of the fourth preferred embodiment of a ferroelectric memory according to the present invention. This embodiment is substantially the same as the first preferred embodiment shown in FIG. 1, except that the resetting transistor of the bit line voltage control circuit 3 is omitted. The capacity ratio of the capacitor C to the bit line is preferably the same as that in the first preferred embodiment.

Figure 9:
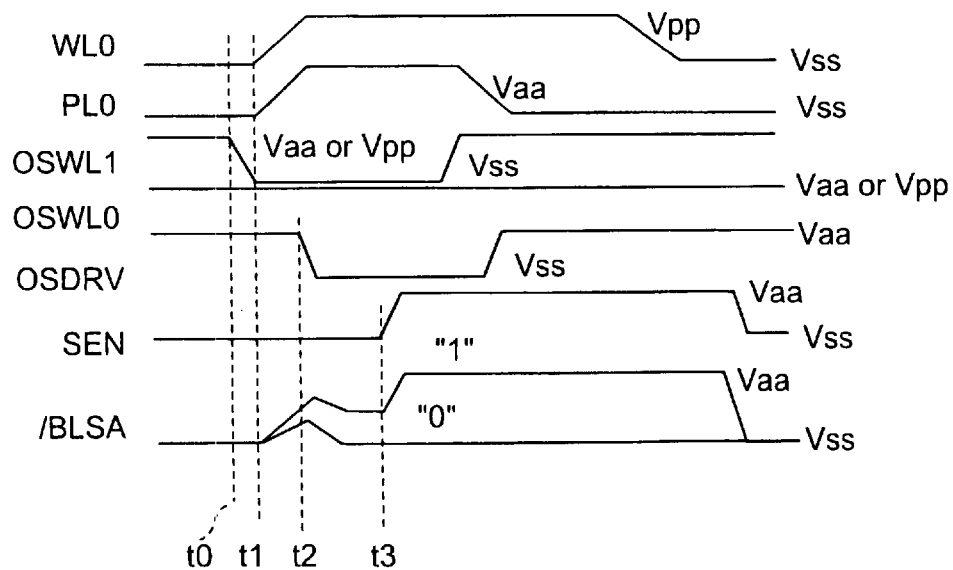
FIG. 9 is a waveform illustration showing the operation of the ferroelectric memory in the fourth preferred embodiment.

The operation wavelength in this preferred embodiment is shown in FIG. 9. In this preferred embodiment, in a stand-by state, the levels of control signal lines OSWL0 and OSWL1 are raised to an "H" level, so that MOS transistors Q11 and Q12 are turned on, and the node N of the capacitor C, together with bit lines BL and /BL, is precharged. Meanwhile, the level of a driving signal line OSDRV is set to be an "H" level. When an active operation is started, the level of the control signal line OSWL1 on the side of the unselected bit line BL is dropped to an "L" level. Therefore, a transistor Q12 is turned off. Substantially simultaneously, the level of the driving signal line OSDRV is dropped to the "L" level.

Thus, only the voltage of a bit line from which data is read out can be dropped by the same operation as that in the first preferred embodiment, so that a high voltage can be applied to the ferroelectric capacitor of a selected memory cell during a reading operation. Therefore, it is possible to obtain the same advantages as those in the first preferred embodiment. In addition, the number of elements of the bit line voltage control circuit 3 decreases, so that it is possible to decrease the area of the circuit.
(Fifth Preferred Embodiment)

Figure 10:
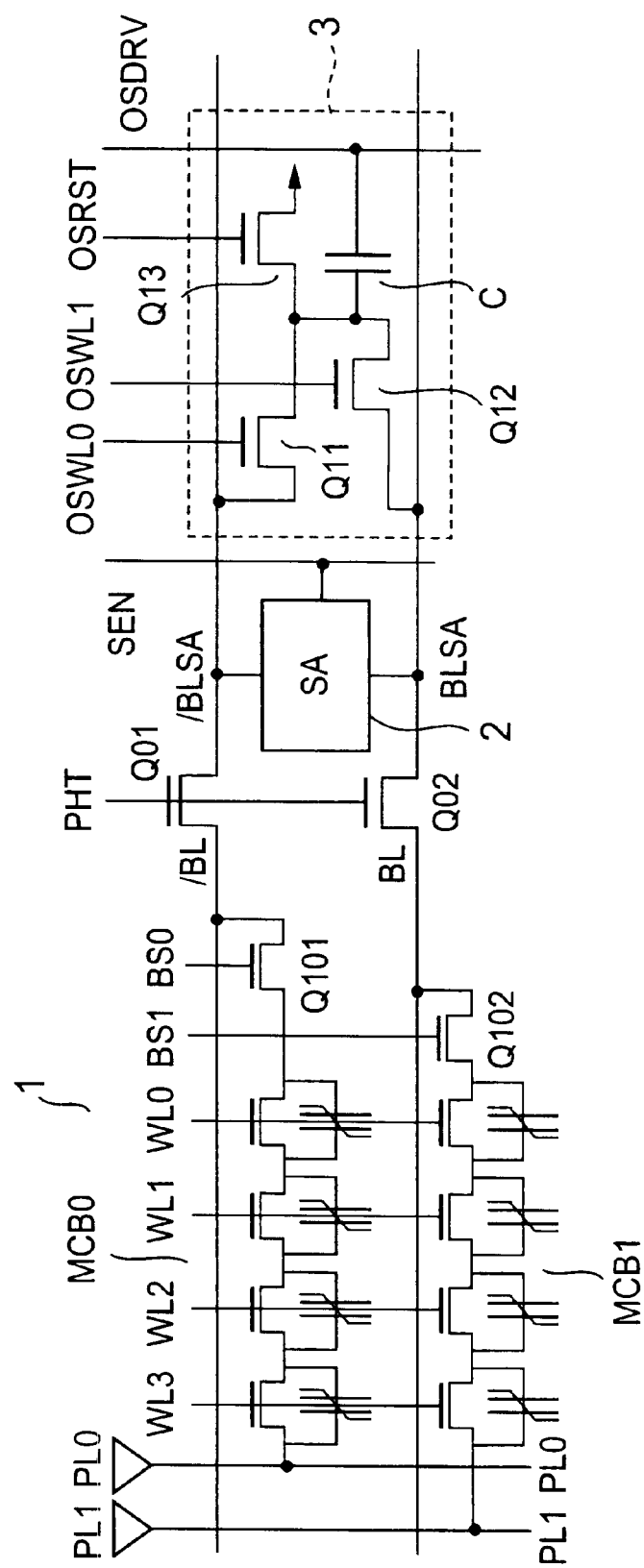
FIG. 10 is a circuit diagram showing the circuit construction of the fifth preferred embodiment of a ferroelectric memory according to the present invention.

FIG. 10 shows the circuit construction of the fifth preferred embodiment of a ferroelectric memory according to the present invention. In this preferred embodiment, the ferroelectric memory is a chain type ferroelectric memory, and a memory cell array 1 constitutes a memory cell block comprising a plurality of memory cells, each of which comprises an NMOS transistor and a ferroelectric capacitor connected thereto in parallel and which are connected in series. FIG. 10 show two memory cell blocks MCB0 and MCB1 which are connected to a pair of bit lines BL and /BL. In the shown embodiment, each of the memory cell blocks MCB0 and MCB1 comprises four memory cells which are connected in series.

The plate electrodes of the ferroelectric capacitors arranged on one ends of the memory cell blocks MCB0 and MCB1 are connected to plate lines PL0 and PL1, respectively, and the other ends thereof are connected to the bit lines /BL and BL via block selecting NMOS transistors Q101 and Q102, which are controlled by block selecting signals BS0 and BS1, respectively. other constructions are the same as those in the first preferred embodiment. The bit line voltage control circuit 3 also has the same circuit construction as that in the first preferred embodiment shown in FIG. 2. The capacity ratio of the capacitor C to the bit line is preferably the same as that in the first preferred embodiment.

In the case of the chain type ferroelectric memory, if one of the block selecting signals BS0 and BS1 has an "H" level, only one of the memory cell blocks MCB0 and MCB1 can be connected to the bit line. Therefore, the same operation as that of the 1T1C cell can be carried out by utilizing one of the pair of bit lines BL and /BL in a data reading operation and using a reference data of a dummy cell.

Figure 11:
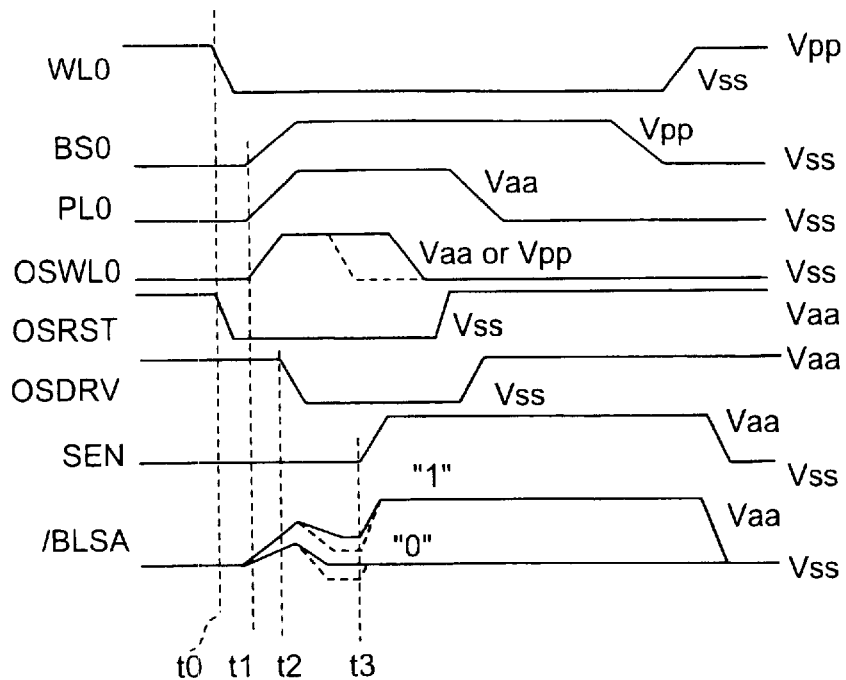
FIG. 11 is a waveform illustration showing the operation of the ferroelectric memory in the fifth preferred embodiment.

FIG. 11 shows the operation waveform of a ferroelectric memory in this preferred embodiment. This operation waveform shows a case where the memory cell block MCB0 is selected and the word line WL0 and the plate line PL0 are selected to carry out reading and rewriting operations. In a stand-by state, a reset signal line OSRST has an "H" level (=Vaa), a driving signal line OSDRV has an "H" level (=Vaa), and control signal lines OSWL0 and OSWL1 have an "L" level (=Vss). Thus, in the bit line voltage control circuit 3, a charge of Vaa C is charged to the capacitor C.

After the level of the reset signal OSRST is dropped to an "L" level and a resetting transistor Q13 is turned off, an active operation is started, so that the level of a selected word line WL0 is raised to an "H" level (=Vpp) and the level of a selected plate line PL0 is raised to the "H" level (=Vaa). Substantially simultaneously or slightly thereafter, the level of the driving signal line OSDRV is dropped to the "L" level. Simultaneously, the level of the control signal line OSWL0 is raised to the "H" level (=Vaa or Vpp). Thus, the transistor Q11 is turned on, so that the node N of the capacitor C is connected to the sense node /BLSB, thus the bit line /BL, in which a selected data is read out.

When the precharging operation of the capacitor C is stopped, the voltage of the node N drops to −Vaa. Since this node N is connected to the bit line /BL from which the selected data is read out, the voltage of the bit line /BL (capacity CB) having being precharged to the Vss is dropped by the capacitor C simultaneously with the voltage rise due to the reading of data.

In other words, the bit line capacity is substantially CB+C, and this is an operation equivalent to an operation wherein it is precharged to −C·Vaa/(CB+C). Therefore, the voltage between the selected plate line PL0 and the bit line /BL is Vaa+C·Vaa)/(CB+C). That is, the voltage applied to the selected ferroelectric capacitor is higher than that in the conventional system by C·Vaa/(CB+C).

After a data signal is read out to the bit line, a sense amplifier activating signal SEN is raised to the "H" level, and the reading signal is amplified by a sense amplifier 2.

Thereafter, the level of the plate line PL0 is returned to the "L" level to carry out are writing operation. About during a sense operation, the level of the control signal line OSWL0 is returned to the "L" level, and the capacitor C is disconnected from the bit line, so that the levels of the reset signal line OSRST and the driving signal line OSDRV are raised to the "H" level, thereby returning to a precharging state.

Also according to this preferred embodiment, it is possible to obtain the same advantages as those in the preceding preferred embodiments. Similar to the above described first preferred embodiment, if the area of the capacitor C of the bit line voltage control circuit 3 increases to lower the bit line voltage, the voltage of the sense node /BLSA can be varied as shown by a broken line in FIG. 11. At this time, the reference bit line voltage can be set to be substantially 0 V. In this case, the dummy cell can be omitted.

(Sixth Preferred Embodiment)

Figure 12:
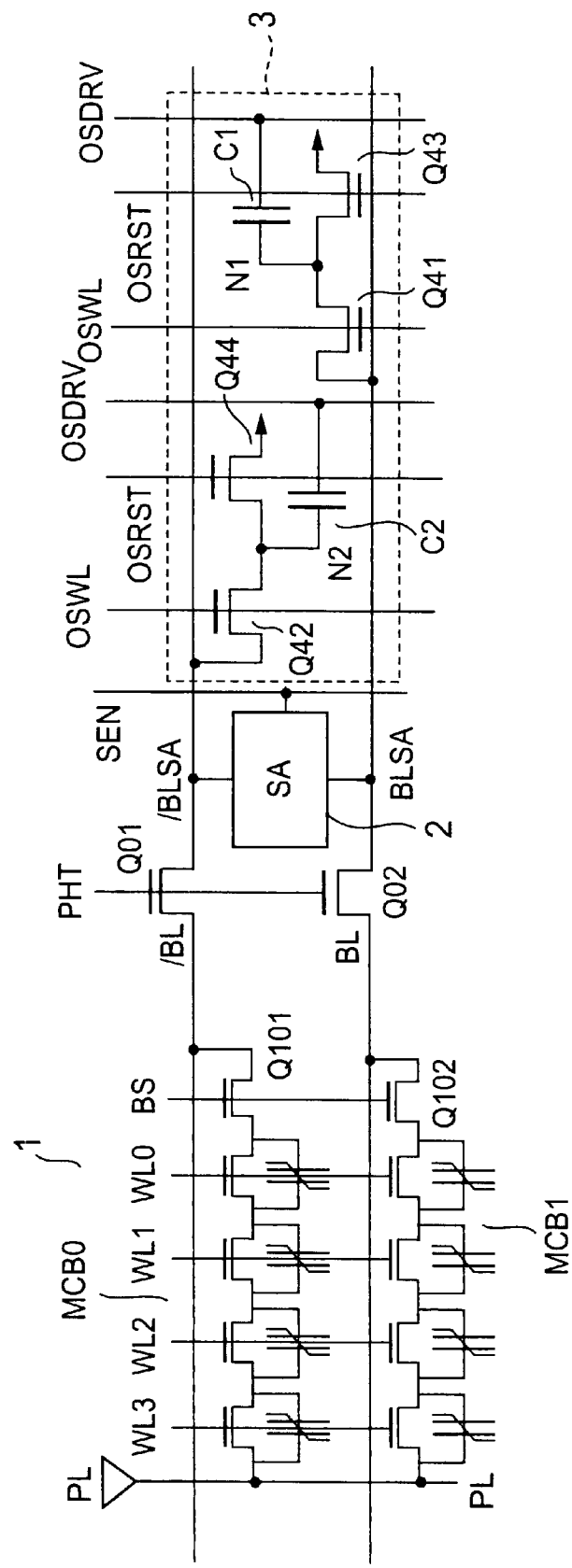
FIG. 12 is a circuit diagram showing the circuit construction of the sixth preferred embodiment of a ferroelectric memory according to the present invention.

FIG. 12 shows the circuit construction of the sixth preferred embodiment of a ferroelectric memory according to the present invention. In this preferred embodiment, a memory cell 1 has a chain type ferroelectric memory construction similar to the fifth preferred embodiment shown in FIG. 10. With respect to two memory cell blocks MCB0 and MCB1, plate lines are commonly connected to a plate line PL, and block selecting transistors Q101 and Q102 are simultaneously selected by a common block selecting signal BS. Therefore, one of a pair of bit lines BL and /BL is utilized for reading data, and the other bit line is used as a reference bit line to carry out the operation of a 2T2C cell.

Therefore, the bit line voltage control circuit 3 has the same construction as that in the second preferred embodiment which uses the 2T2C cell and which is shown in FIG. 4, and is provided with coupling capacitors C1 and C2 on the sides of the bit lines BL and /BL, respectively. The nodes N1 and N2 of the capacitors C1 and C2 are connected to sense nodes BLSA and IBLSA via NMOS transistors Q41 and Q42, respectively. The transistors Q41 and Q42 are simultaneously on-off-controlled by the same control signal line OSWL. The nodes N1 and N2 are provided with resetting NMOS transistors Q43 and Q44, respectively. The transistors Q43 and Q44 are also simultaneously on-off-controlled by the same control signal line OSRST. Moreover, the reference terminals of the capacitors C1 and C2 are similarly driven by a common driving signal line OSDRV. The capacity ratios of the capacitors C1 and C2 to the bit lines are preferably the same as that in the first preferred embodiment.

Figure 13:
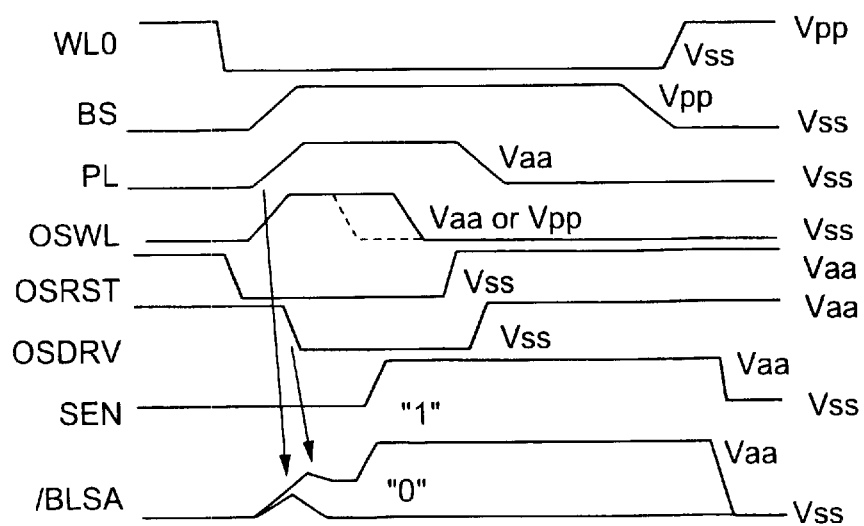
FIG. 13 is a waveform illustration showing the operation of the ferroelectric memory in the sixth preferred embodiment.

FIG. 13 shows the operation waveform of a ferroelectric memory in this preferred embodiment. Similar to the above described chain type ferroelectric memory, the levels of the word lines are held to be an "H" level in a stand-by state, and the level of a selected word line WL0 is dropped to an "L" level during a data reading operation. Then, the levels of the plate lines PL and a block selecting signal BS are raised to the "H" level, so that complementary selected memory cell data of two memory cell blocks MCB0 and MCB1 are read out to the bit lines /BL and BL. Substantially simultaneously, the capacitors C1 and C2 of the bit line voltage control circuit 3 are connected to the bit lines /BL and BL, respectively, to drop the voltage thereof. Also according to this preferred embodiment, it is possible to obtain the same advantages as those in the preceding preferred embodiments.

(Seventh Preferred Embodiment)

Figure 14:
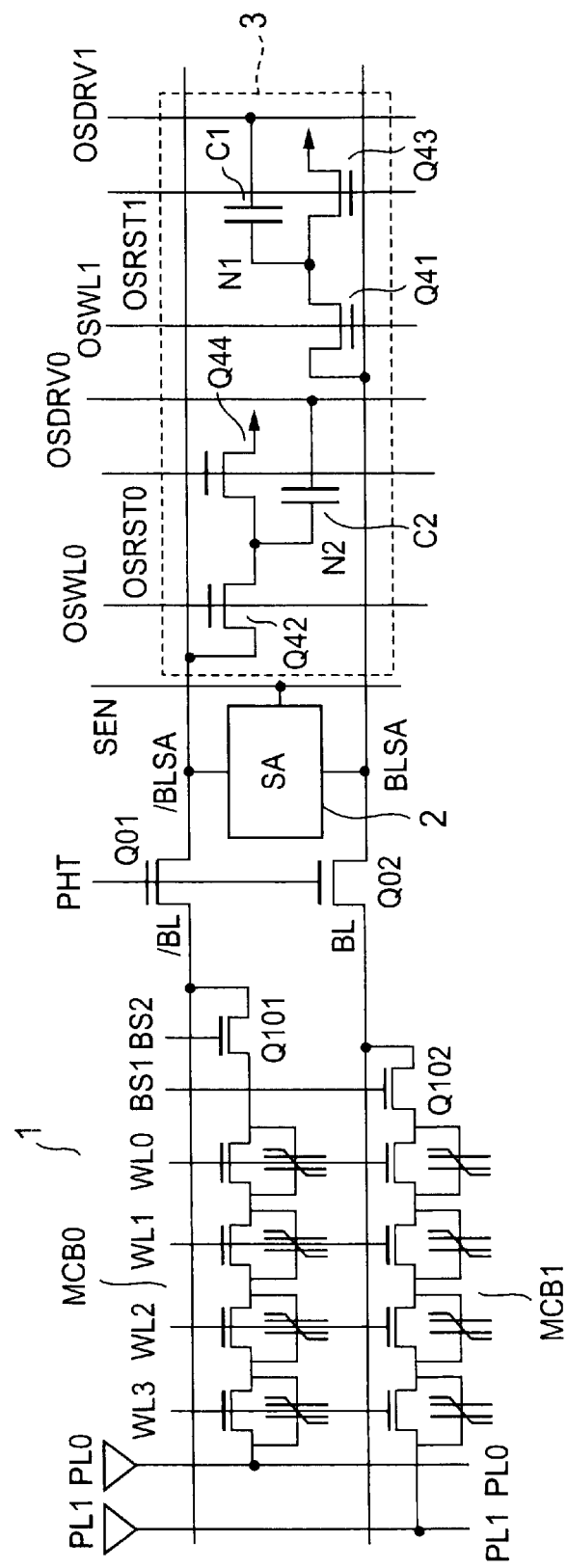
FIG. 14 is a circuit diagram showing the circuit construction of the seventh preferred embodiment of a ferroelectric memory according to the present invention.

FIG. 14 shows the circuit construction of the seventh preferred embodiment of a ferroelectric memory according to the present invention. In this preferred embodiment, a memory cell array 1 has a chain type ferroelectric memory construction.

Memory cell blocks MCB0 and MCB1 are separately provided with plate lines PL0 and PL1, respectively, and separate block selecting signal lines BS0 and BS1 are prepared for block selecting transistors Q101 and Q102. Therefore, the operation of the 1T1C configuration can be carried out. However, if the plate lines PL0 and PL1 are commonly connected and the block selecting signal lines BS0 and BS1 are commonly connected, the operation of the 2T2C configuration can also be carried out.

Therefore, the bit line voltage control circuit 3 has the same construction as that in FIG. 12, which is required for carrying out the 2T2C operation. The capacity ratios of the capacitors C1 and C2 to the bit lines are preferably the same as that in the first preferred embodiment. If it is used as a 1T1C cell, only one of the capacitors C1 and C2 is utilized during a reading operation. Therefore, the control signal lines OSWL1 and OSWL0 of the transistors Q41 and Q42 are separately prepared. The control signal lines OSRST1 and OSRST0 of the resetting transistors Q43 and Q44, and driving signal lines OSDRV1 and OSDRV2 are also separately prepared.

Figure 15:
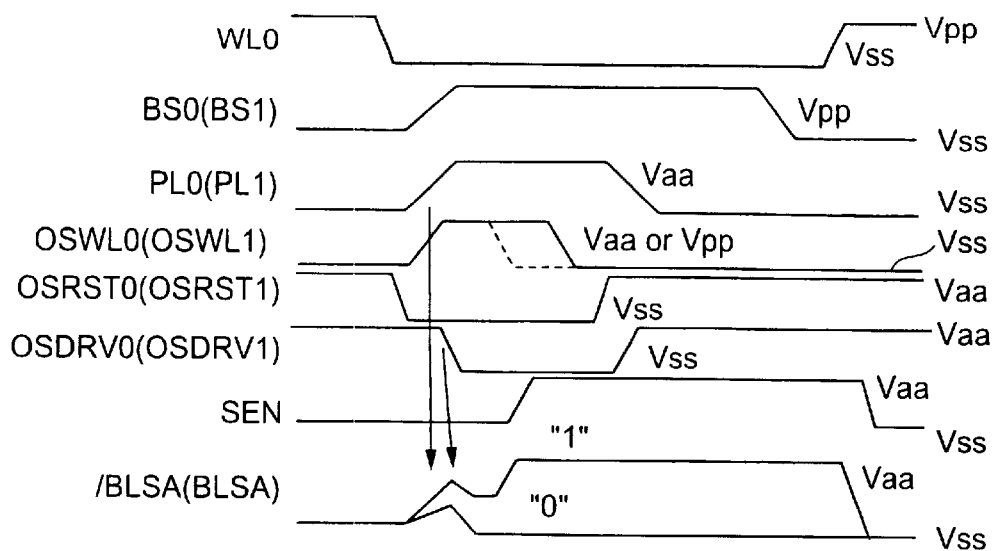
FIG. 15 is a waveform illustration showing the operation of the ferroelectric memory in the seventh preferred embodiment.

FIG. 15 shows the operation waveform of a ferroelectric memory in the this preferred embodiment. If it is operated as a 1T1C cell, when the word line WL0 and the plate line PL0 are selected, a control signal line OSWL0, a reset signal line OSRST0 and a driving signal line OSDRV0 are selected in synchronism therewith similar to the first preferred embodiment. At this time, the voltage of a selected bit line /BL is dropped by the capacitor C2, and the capacitor C1 remains being in a precharge state. If it is operated as a 2T2C cell, the word lines WL0, WL1 and the plate lines PL0, PL1 are simultaneously selected as shown in parenthesis of FIG. 15. In accordance therewith, the respective control circuits of the bit line voltage control circuit 3 are simultaneously synchronous-controlled with respect to the two capacitors C1 and C2. Also according to this preferred embodiment, it is possible to obtain the same advantages as those in the preceding preferred embodiments.

(Eighth Preferred Embodiment)

Figure 16:
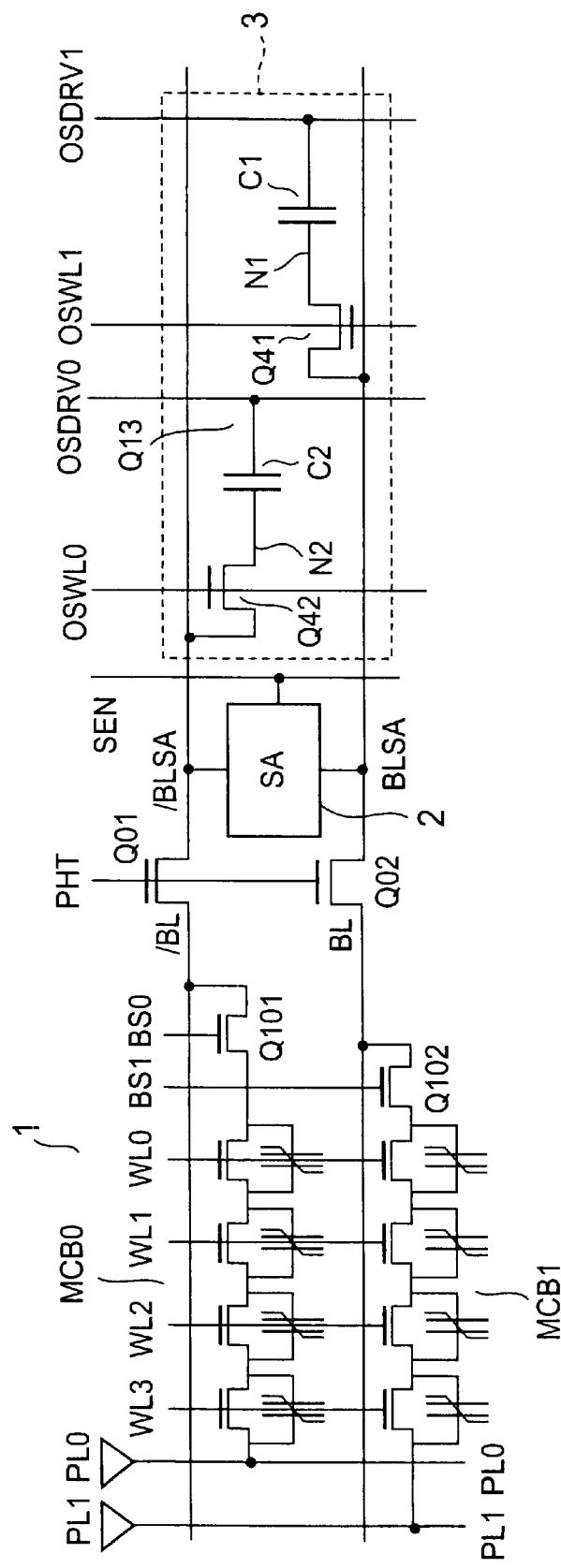
FIG. 16 is a circuit diagram showing the circuit construction of the eighth preferred embodiment of a ferroelectric memory according to the present invention.

FIG. 16 shows the circuit construction of the eighth preferred embodiment of a ferroelectric memory according to the present invention. This circuit construction is basically the same as the circuit construction in the seventh preferred embodiment shown in FIG. 14, except that the resetting transistors Q43 and Q44 of the bit line voltage control circuit 3 are omitted.

Similar to the seventh preferred embodiment shown in FIG. 14, capacitors C1 and C2 are provided for enabling the 1T1C cell operation and the 2T2C cell operation. The capacity ratios of these capacitors to the bit lines are preferably the same as that in the first preferred embodiment.

Figure 17:
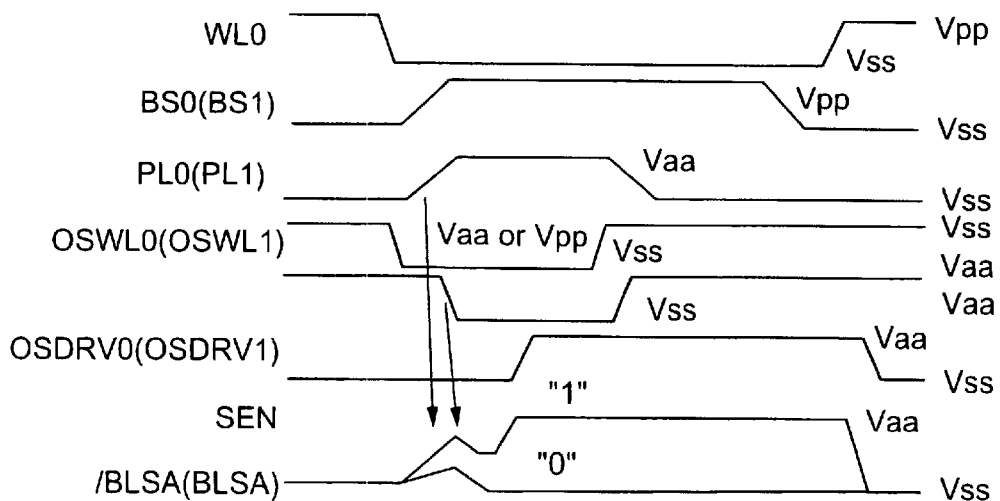
FIG. 17 is a waveform illustration showing the operation of the ferroelectric memory in the eighth preferred embodiment.

The operation waveform in this preferred embodiment is shown in FIG. 17. In the case of the operation of a 1T1C cell, only one of the capacitors C1 and C2 is used, and in the case of the operation of a 2T2C cell, both of the capacitors C1 and C2 are used. This is the same as the seventh preferred embodiment shown in FIG. 14. In the case of the 1T1C cell operation, in a stand-by state, the levels of control signal lines OSWL0 and OSWL1 are raised to an "H" level, so that MOS transistors Q42 and Q41 are turned on, and the nodes N2 and N1 of the capacitors C2 and C1, together with bit lines /BL and BL, are precharged to Vss. Meanwhile, the levels of driving signal lines OSDRV0 and OSDRV1 are set to be an "H" level. When an active operation is started, the level of the control signal line OSWL1 (or OSWL0) on the side of an unselected bit line BL (or /BL) is dropped to an "L" level. Therefore, a transistor Q41 (or Q42) is turned off. Substantially simultaneously, the level of the driving signal line OSDRV0 (or OSDRV1) is dropped to the "L" level.

Thus, only the voltage of a bit line from which data is read out can be dropped by the same operation as that in the first preferred embodiment, so that a high voltage can be applied to the ferroelectric capacitor of a selected memory cell during a reading operation. In addition, the number of elements of the bit line voltage control circuit 3 is smaller than that in the seventh preferred embodiment shown in FIG. 14, so that it is possible to decrease the area of the circuit. In the case of the operation of a 2T2C cell, the potentials of the bit lines BL and /BL are simultaneously dropped by the capacitors C1 and C2, respectively, as described in the seventh preferred embodiment shown in FIG. 14.

(Ninth Preferred Embodiment)

Figure 18:
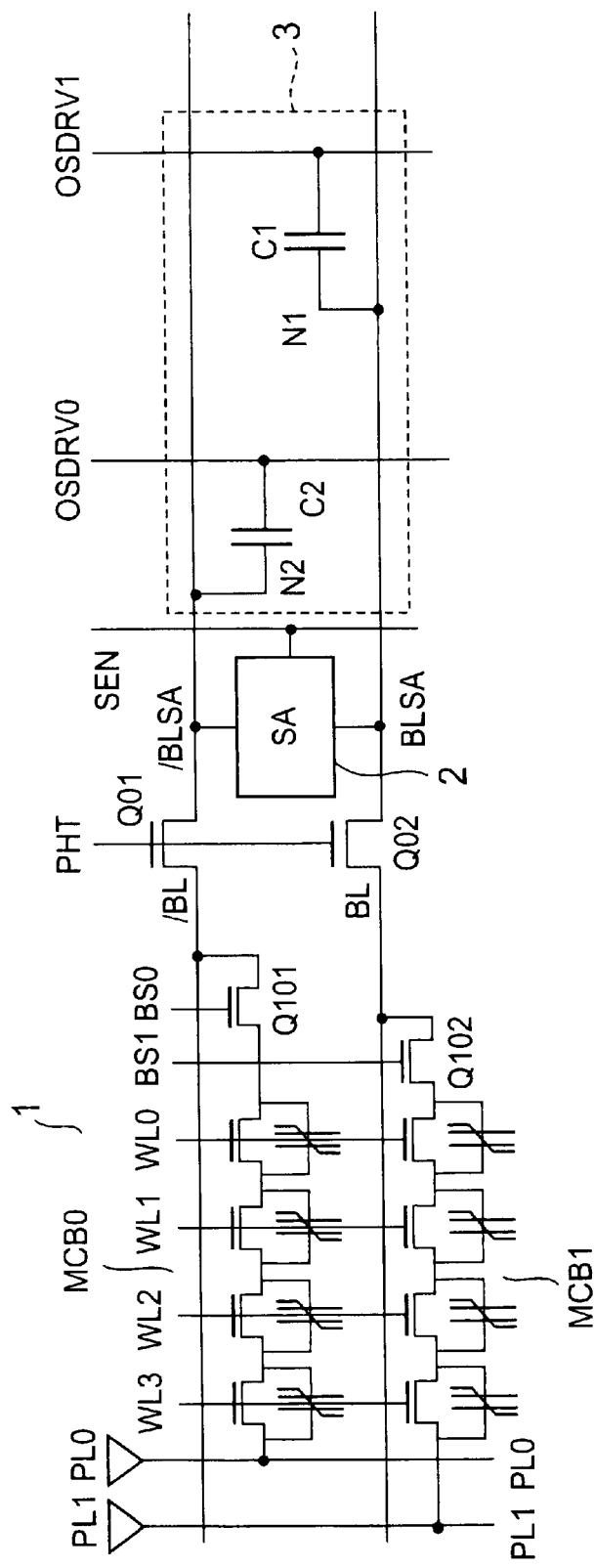
FIG. 18 is a circuit diagram showing the circuit construction of the ninth preferred embodiment of a ferroelectric memory according to the present invention.

FIG. 18 shows the circuit construction of the ninth preferred embodiment of a ferroelectric memory according to the present invention. This construction is basically the same as that in the eighth preferred embodiment shown in FIG. 16, except that the transistors Q41 and Q42 of the bit line voltage control circuit 3 are removed and the nodes N1 and N2 of capacitors C1 and C2 are connected directly to sense nodes BLSA and /BLSA, thus bit lines BL and /BL. Also in this case, the capacity ratios of the capacitors C1 and C2 to the bit lines are preferably the same as that in the first preferred embodiment.

Figure 19:
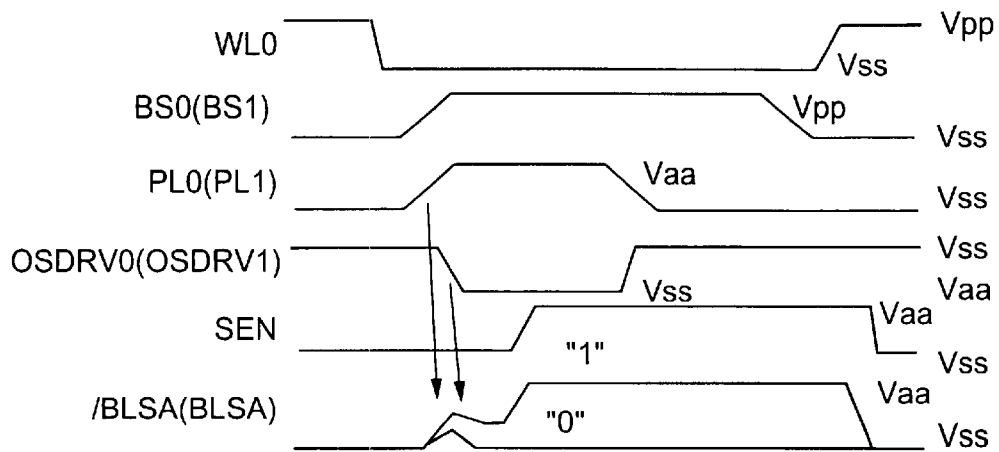
FIG. 19 is a waveform illustration showing the operation of the ferroelectric memory in the ninth preferred embodiment.

FIG. 19 shows the operation waveform of a ferroelectric memory in this preferred embodiment. If the operation of the 1T1C construction is carried out, during a reading operation, the level of one of block selecting signals BS0 and BS1 is raised to an "H" level, and the level of one of plate lines PL0 is raised to an "H" level. Thereafter, before activating a sense amplifier circuit, one of precharging signal lines OSDRV1 and OSDRV0 of the capacitors C1 and C2, which have an "H" level in a stand-by state, is dropped to an "L" level. Thus, the voltage of a bit line from which a data is read out is dropped, so that it is possible to obtain the same advantages as those in the first preferred embodiment.

Furthermore, if the operation of the 2T2C construction is carried out, the levels of the block selecting signals BS0 and BS1 are simultaneously raised to the "H" level, the levels of the plate lines PL0 and PL1 are also simultaneously raised to the "H" level, and the levels of the driving signal lines OSDRV1 and OSDRV0 are also simultaneously dropped to the "L" level. In addition, if the operation of the ITIC construction is carried out, the levels of the driving signal lines OSDRV1 and OSDRV0 may be simultaneously dropped to the "L" level. In this case, although the bit line voltage on the reference side is also dropped, there is no problem if it is raised to a required voltage by a dummy cell.

(Tenth Preferred Embodiment)

Figure 20:
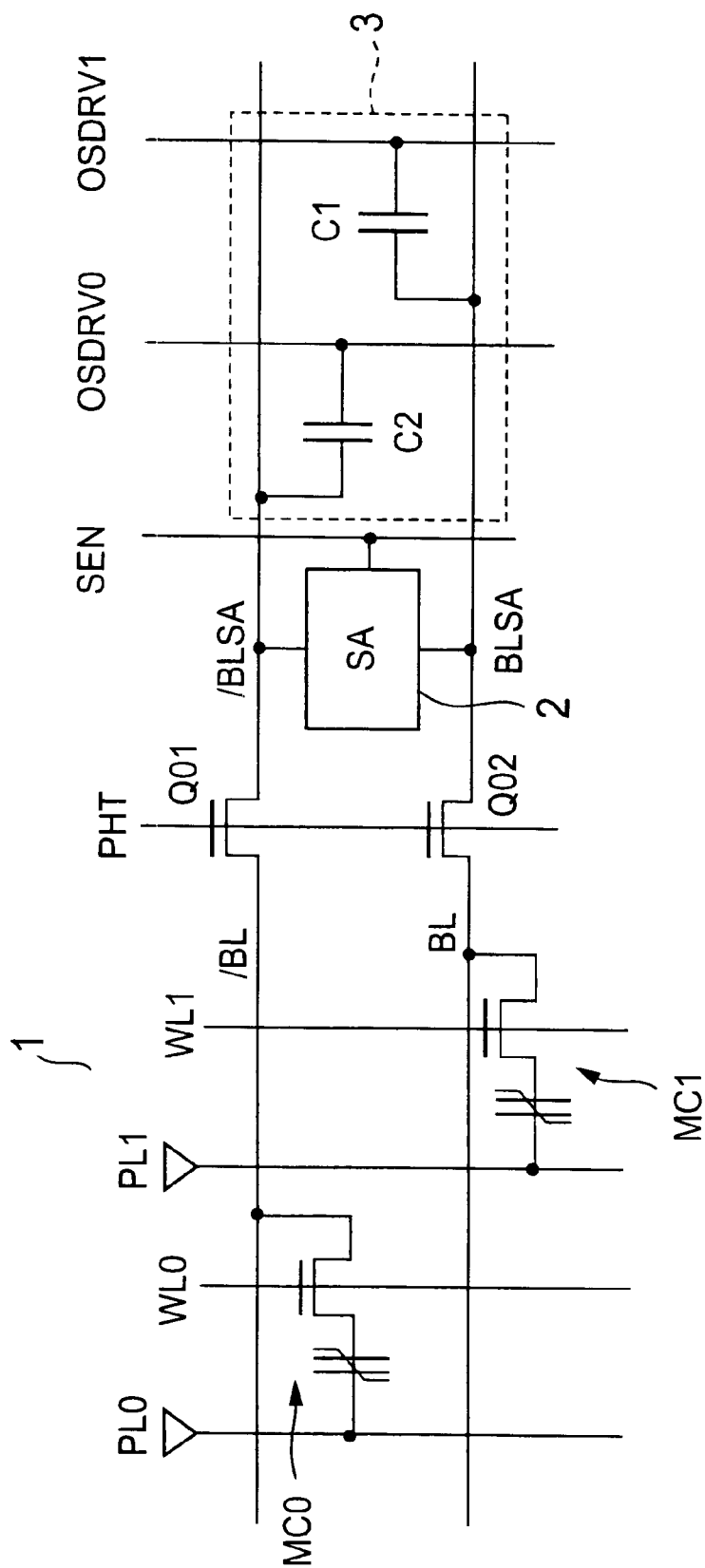
FIG. 20 is a circuit diagram showing the circuit construction of the tenth preferred embodiment of a ferroelectric memory according to the present invention.

FIG. 20 is a circuit diagram showing the construction of the tenth preferred embodiment of a ferroelectric memory according to the present invention. In the tenth preferred embodiment, the construction of the bit line voltage control circuit 3 in the ninth preferred embodiment shown in FIG. 18 is applied to a memory cell array 1 comprising usual 1T1C cells. That is, the nodes N1 and N2 of capacitors C1 and C2 are connected directly to sense nodes BLSA and /BLSA, thus bit lines BL and /BL, respectively. Also in this case, the capacity ratios of the capacitors C1 and C2 to the bit lines are preferably the same as that in the first preferred embodiment.

Figure 21:
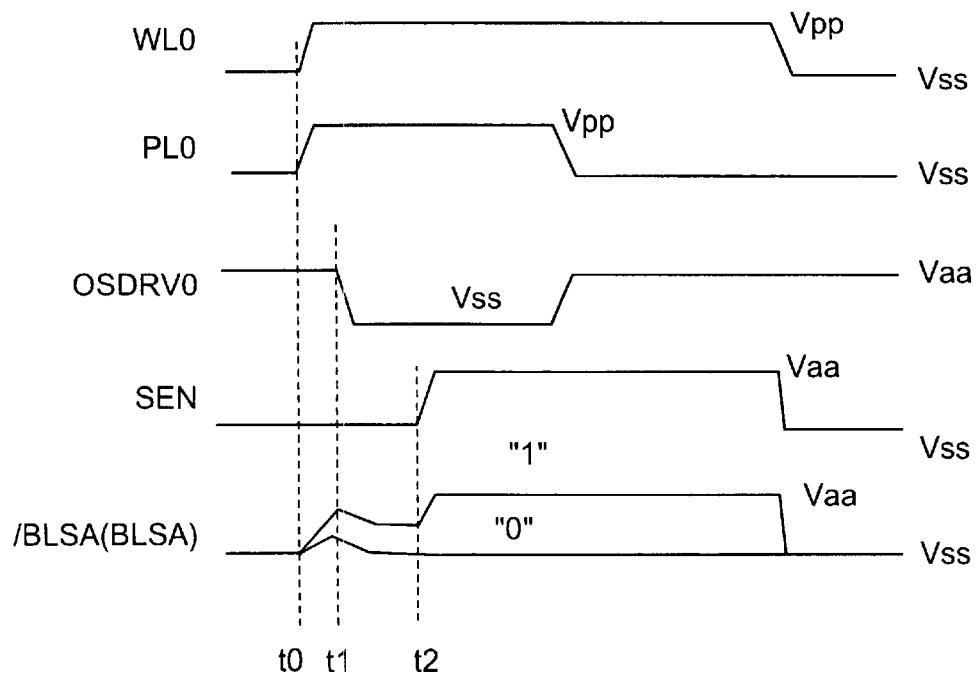
FIG. 21 is a waveform illustration showing the operation of the ferroelectric memory in the tenth preferred embodiment.

FIG. 21 shows the operation waveform of a ferroelectric memory in this preferred embodiment. In a stand-by state, the levels of driving signal lines OSDRV0 and OSDRV1 are held to be an "H" level. During a data reading operation, a selected word line WL0 and the driving signal line OSDRV0 are set so as to have the "H" level (t0), and substantially simultaneously or slightly thereafter, the level of the driving signal line OSDRV0 is dropped to an "L" level (t1). Thereafter, a sense amplifier is activated (t2). Thus, similar to the first preferred embodiment, a large voltage is applied to the ferroelectric capacitor by the coupling of the capacitor C2, so that it is possible to obtain the same advantages as those in the first preferred embodiment.

(Eleventh Preferred Embodiment)

Figure 22:
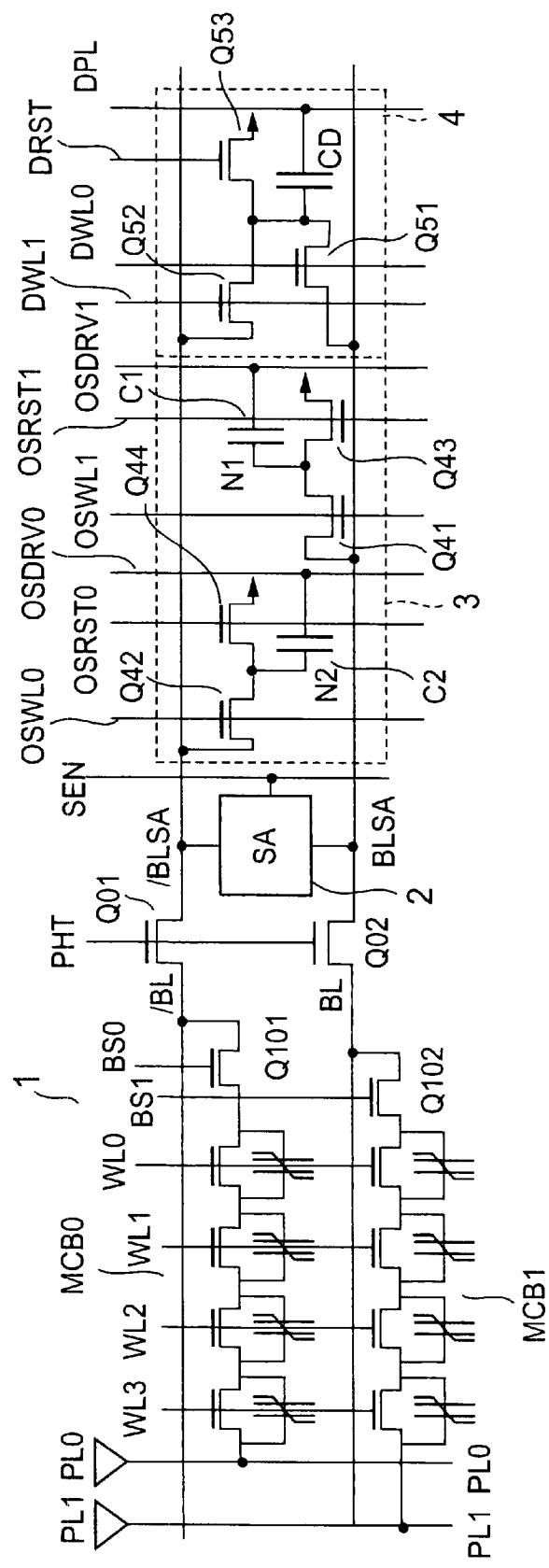
FIG. 22 is a circuit diagram showing the circuit construction of the eleventh preferred embodiment of a ferroelectric memory according to the present invention.

FIG. 22 is a circuit diagram showing the construction of the eleventh preferred embodiment of a ferroelectric memory according to the present invention. The ferroelectric memory in the eleventh preferred embodiment has a detailed construction where a dummy cell 4 required for carrying out the operation of the 1T1C construction is added to the seventh preferred embodiment shown in FIG. 14. The dummy cell 4 comprises a dummy cell capacitor CD, NMOS transistors Q51 and Q52 which are driven by dummy word lines DWL0 and DWL1 for selectively connecting the dummy cell capacitor CD to bit lines /BL and BL, and a resetting NMOS transistor Q53 which is driven by a reset signal DRST. One end of the dummy cell capacitor CD is connected to a dummy plate line DPL.

Figure 23:
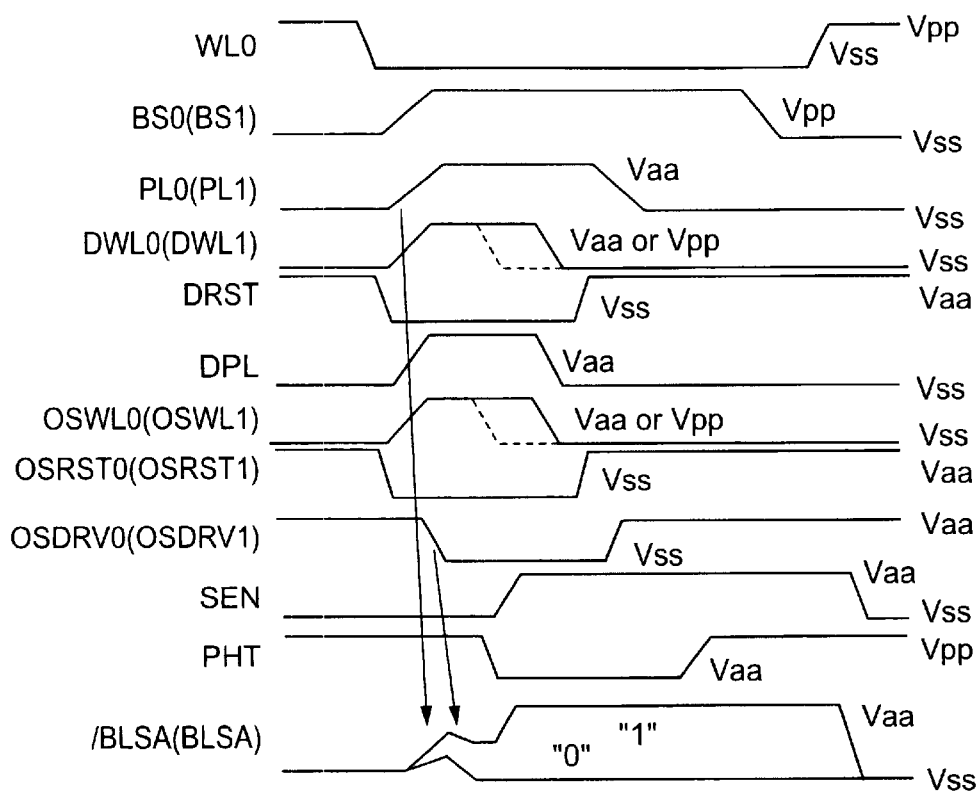
FIG. 23 is a waveform illustration showing the operation of the ferroelectric memory in the eleventh preferred embodiment.

FIG. 23 shows the operation waveform of a ferroelectric memory in this preferred embodiment. Although this operation waveform is basically the same as that in FIG. 15, FIG. 23 also shows the operation of the dummy cell 4. That is, in the case of the operation of the 1T1C cell construction, a memory cell data is read out to a selected bit line, e.g., BL, the data of the dummy cell 4 is read out to a sense node /BLSA on the side of the unselected bit line as a reference potential. Furthermore, FIG. 23 shows the state that a voltage Vpp boosted to be higher than Vaa is usually applied to NMOS transistors Q01 and Q02 provided between a sense amplifier circuit 2 and a memory cell array 1 to be synchronous with the activation of the sense amplifier to be Vaa. Because a rapid sense is enabled by transferring a bit line voltage to a sense node without the lowering thereof during a data reading operation and by disconnecting a selected bit line from the sense node during the activation of the sense amplifier.

Also according to this preferred embodiment, it is possible to obtain the same advantages as those in the preceding preferred embodiment. Then, the cell capacitor CD of the dummy cell 4 can have a smaller area than that in the conventional case by providing the bit line voltage control circuit 3. In the above described preferred embodiments, a high voltage is applied to the ferroelectric capacitor by dropping the potential of a bit line which is driven by a plate line and from which a data is read out. The same advantages can be realized by raising the voltage of a plate line from a usual voltage during a reading operation. Such a preferred embodiment will be described below.

(Twelfth Preferred Embodiment)

Figure 24:
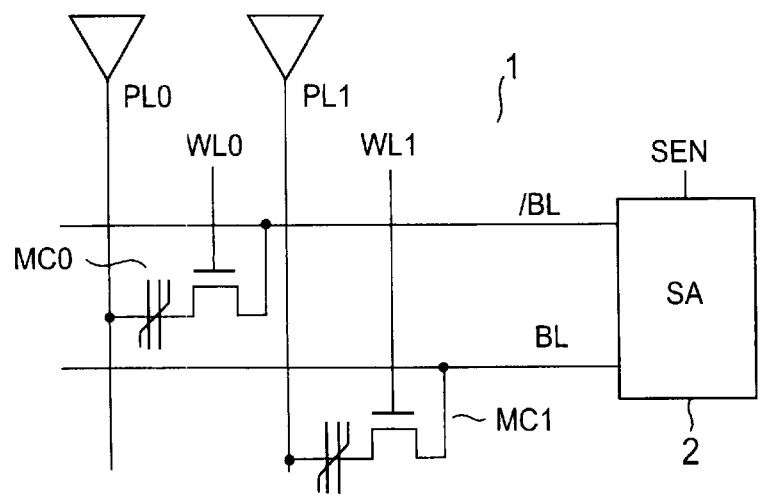
FIG. 24 is a circuit diagram showing the circuit construction of the twelfth preferred embodiment of a ferroelectric memory according to the present invention.
Figure 25:
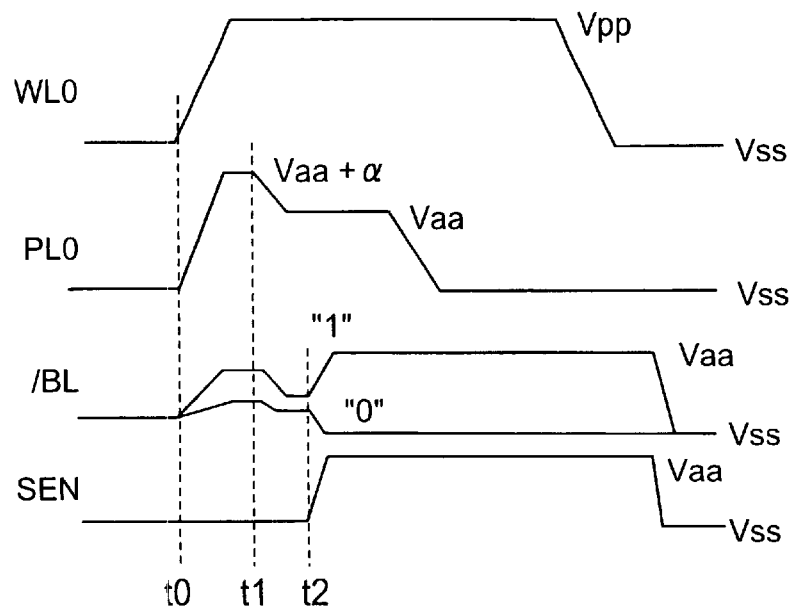
FIG. 25 is a waveform illustration showing the operation of the ferroelectric memory in the twelfth preferred embodiment.

FIG. 24 is a circuit diagram showing the construction of a ferroelectric memory according to the present invention. In this preferred embodiment, a memory cell 1 has a usual 1T1C cell construction. The bit line voltage control circuit having a coupling capacitor described in the preceding preferred embodiments is not used in this preferred embodiment. FIG. 25 shows the operation of a ferroelectric memory in this preferred embodiment.

During a data reading operation, a boosted voltage Vpp is applied to a selected word line WL0 (t0). To a plate line PL0 selected simultaneously therewith, a voltage Vaa+a boosted by a from a power supply voltage Vaa which is an amplitude voltage of a bit line is applied. Thus, a higher voltage than that in the conventional case is applied to a ferroelectric capacitor selected in the same manner as that in each of the preceding preferred embodiments, so that a reading signal quantity increases.

Thereafter, the voltage of the selected plate line PL0 is returned to the power supply voltage Vaa (t1), and thereafter, the level of a sense amplifier activating signal SEN is raised to an "H" level (t2). Thus, the selected bit line is amplified to Vaa or Vss in accordance with "1" or "0" data. Then, the voltage of the selected plate line PL0 is returned from Vaa to Vss, so that a reading data is rewritten.

In this preferred embodiment, although there is the possibility that the reliability of a memory cell transistor may be deteriorated by raising the voltage of the plate line, there is an advantages in that the signal quantity is not lowered by increasing the bit line capacity unlike the preferred embodiment where the coupling capacitor is connected to the bit line. In addition, since the bit line voltage is not raised, it is possible to reduce current consumption due to the charge and discharge of the bit line.

(Thirteenth Preferred Embodiment)

Figure 26:
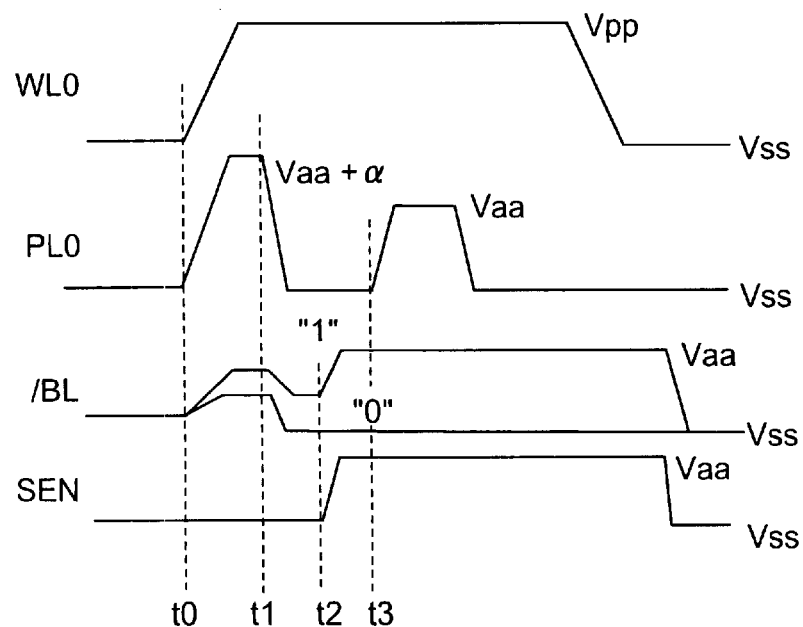
FIG. 26 is a waveform illustration showing the operation of the ferroelectric memory in the thirteenth preferred embodiment.

FIG. 26 shows a modified example of the operation waveform of FIG. 25 with respect to the circuit construction of the thirteenth preferred embodiment of the present invention shown in FIG. 24. The difference between the operation waveform shown in this figure and the operation waveform shown in FIG. 25 is as follows. After a reading voltage of Vaa+α is applied to a selected plate line PL0 at time t0, the voltage of the plate line PL0 is returned once to Vss at time t1. Thereafter, a sense amplifier circuit is activated (t2) to amplify a reading signal, and thereafter, Vaa is applied again to the selected plate line PL0 for rewriting (t3). This method can more easily control the voltage of the plate line than the case shown in FIG. 25. There are also advantages in that during a reading operation, the influence of the capacity of a paraelectric can be canceled, a reference potential can be set to be a low potential, and the capacity of a dummy capacitor can be small.

(Fourteenth Preferred Embodiment)

Figure 27:
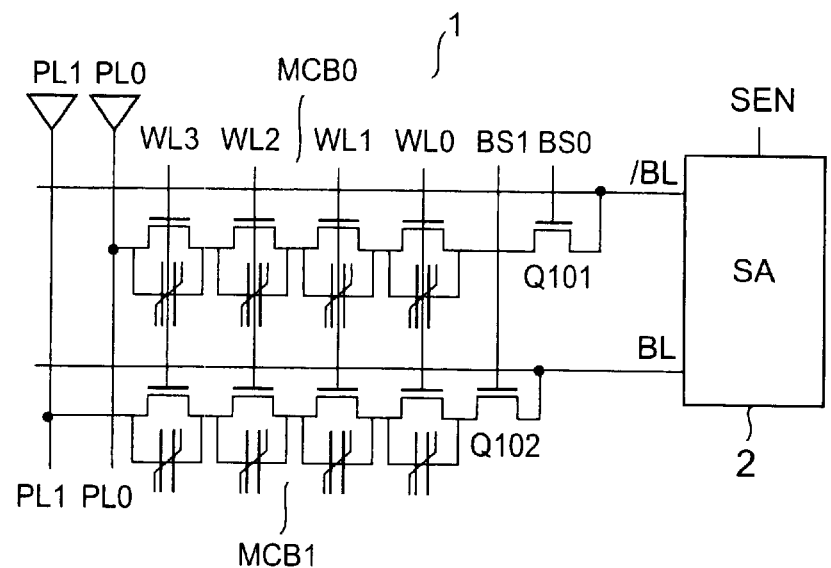
FIG. 27 is a circuit diagram showing the circuit construction of the fourteenth preferred embodiment of a ferroelectric memory according to the present invention.
Figure 28:
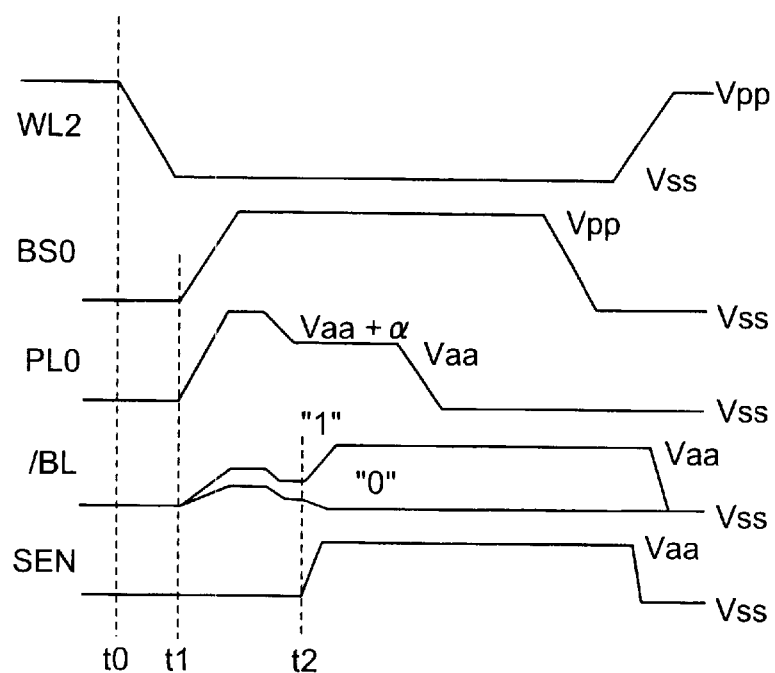
FIG. 28 is a waveform illustration showing the operation of the ferroelectric memory in the fourteenth preferred embodiment.

FIG. 27 is a circuit diagram showing the construction of the fourteenth preferred embodiment of a ferroelectric memory according to the present invention. In this preferred embodiment, a memory cell array 1 has a chain type ferroelectric memory construction. Also in this preferred embodiment, a bit line voltage control circuit having a coupling capacitor is not used. FIG. 28 shows the operation waveform in this preferred embodiment.

During a data reading operation, the voltage of a selected word line WL0 of word lines, all of which have an "H" level (=Vpp), is set to be Vss in a stand-by state (t0). Then, the level of a block selecting signal BS0 i aised to the "H" level (=Vpp). To a plate line PL0 selected simultaneously therewith, a voltage Vaa+α slightly boosted by α from a power supply voltage Vaa is applied (t1). Thus, a higher voltage than that in the conventional system is applied to a ferroelectric capacitor selected in the same manner as that in preceding preferred embodiments, so that a reading signal quantity increases.

Thereafter, the voltage of the selected plate line PL0 is returned to the power supply voltage Vaa, and thereafter, the level of a sense amplifier activating signal SEN is raised to the "H" level (t2). Thus, the selected bit line is amplified to Vaa or Vss in accordance with "1" or "0" data. Then, the voltage of the selected plate line PL0 is returned from Vaa to Vss, so that a reading data is rewritten. Also according to this preferred embodiment, it is possible to obtain the same advantages as those described in the above described twelfth preferred embodiment.

(Fifteenth Preferred Embodiment)

Figure 29:
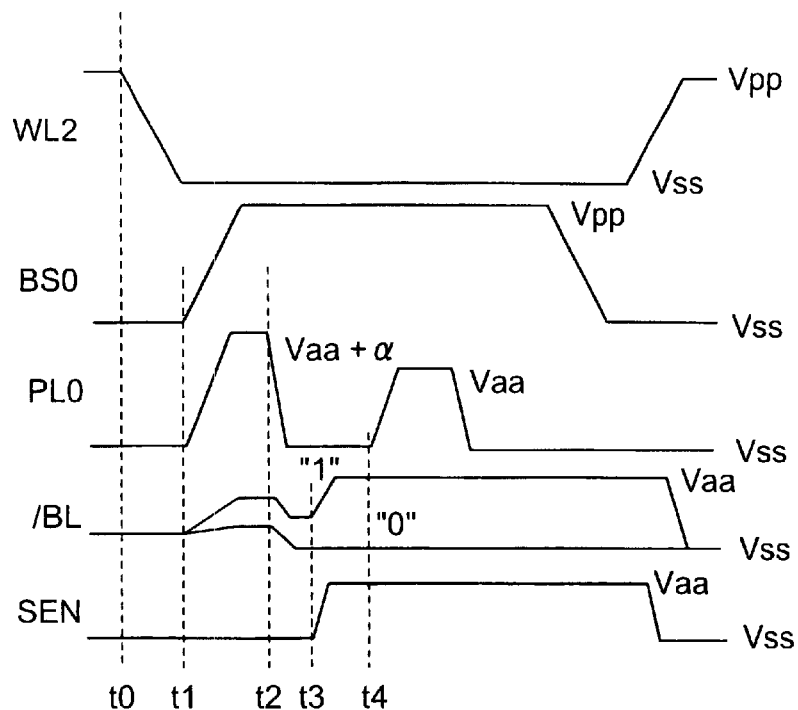
FIG. 29 is a waveform illustration showing the operation of the ferroelectric memory in the fifteenth preferred embodiment.

FIG. 29 shows the fifteenth preferred embodiment of an operation waveform according to the present invention, which is obtained by modifying the operation waveform of FIG. 28, with respect to the circuit construction of the fourteenth preferred embodiment of the present invention shown in FIG. 27. The difference between the operation waveform shown in this figure and the operation waveform shown in FIG. 28 is as follows. After a reading voltage of Vaa+α is applied to a selected plate line PL0 at time t1, the voltage of the plate line PL0 is returned once to Vss at time t2. Thereafter, a sense amplifier circuit is activated (t3) to amplify a reading signal, and thereafter, Vaa is applied again to the selected plate line PL0 for rewriting (t4). This method is the same as the case of FIG. 26 with respect to FIG. 25, and can the same advantages as those described referring to FIG. 26.

(Sixteenth Preferred Embodiment)

Figure 30:
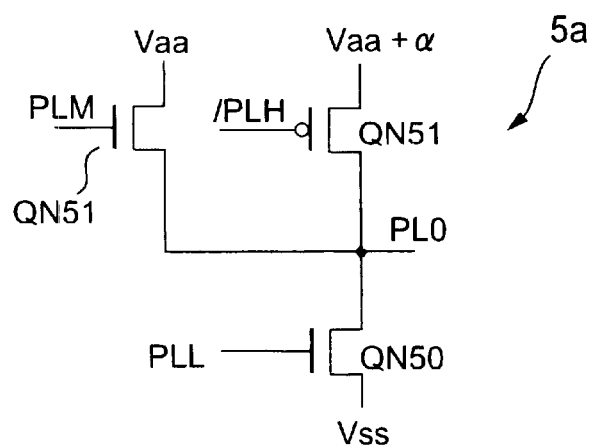
FIG. 30 is a circuit diagram showing the circuit construction of a plate line driving circuit of the sixteenth preferred embodiment of a ferroelectric memory according to the present invention.

FIG. 30 is a circuit diagram showing the construction of a plate line driving circuit 5a of the sixteenth preferred embodiment of a ferroelectric memory according to the present invention. The plate line driving circuit 5a has an example of a construction for obtaining the operation waveform shown in FIG. 25 or 28. The plate line driving circuit 5a comprises an NMOS transistor QN51 to which a voltage Vaa for driving a plate line PL0 has been applied, and a PMOS transistor QP51 which is connected in parallel to the NMOS transistor QN51 and to which a voltage Vaa+α has been applied. The plate line PL0 is also provided with a resetting NMOS transistor QN50.

Figure 32:
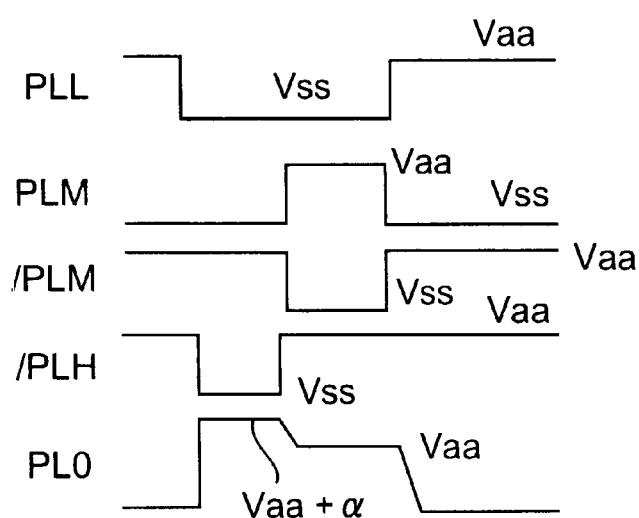
FIG. 32 is a waveform illustration showing the operation of the ferroelectric memory in the sixteenth and seventeenth preferred embodiments.

As shown in FIG. 32, when the level of a reset signal PLL is an "H" level, the resetting transistor QN50 is turned on, so that the voltage of the plate line PL0 is held to be Vss. When the reset is canceled and the levels of control signals PLM and /PLH become "H" and "L" levels, respectively, both of the NMOS transistors QN51 and the PMOS transistor QP51 are turned on to apply Vaa+α, which is higher than the amplitude voltage Vaa of a bit line, to the plate line PL0. Thereafter, when the level of the control signal /PLH becomes the "H" level, the PMOS transistor QP51 is turned off, so that Vss is applied to the plate line PL0 by only the NMOS transistor QN51.

(Seventeenth Preferred Embodiment)

Figure 31:
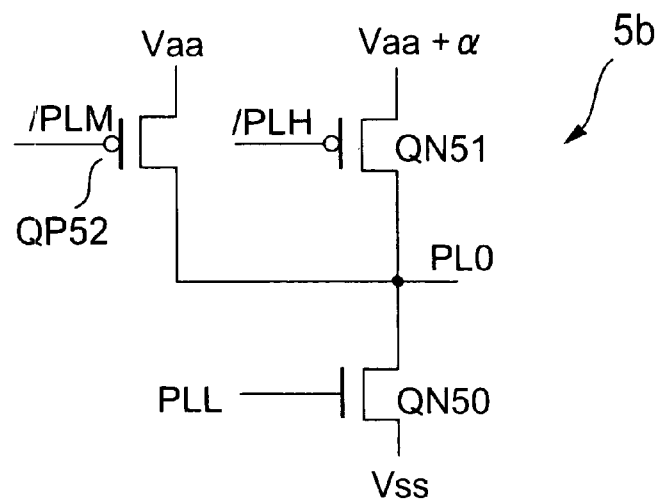
FIG. 31 is a circuit diagram showing the circuit construction of a plate line driving circuit of the seventeenth preferred embodiment of a ferroelectric memory according to the present invention.

FIG. 31 shows another plate line driving circuit 5b. This circuit is designed to control a PMOS transistor QP52, which is substituted for the NMOS transistor QN51 of FIG.

30, by a control signal /PLM which is complementary to that in FIG. 30. Also in this case, it is possible to obtain the same plate line driving voltage as shown in FIG. 32.

(Eighteenth Preferred Embodiment)

Figure 33:
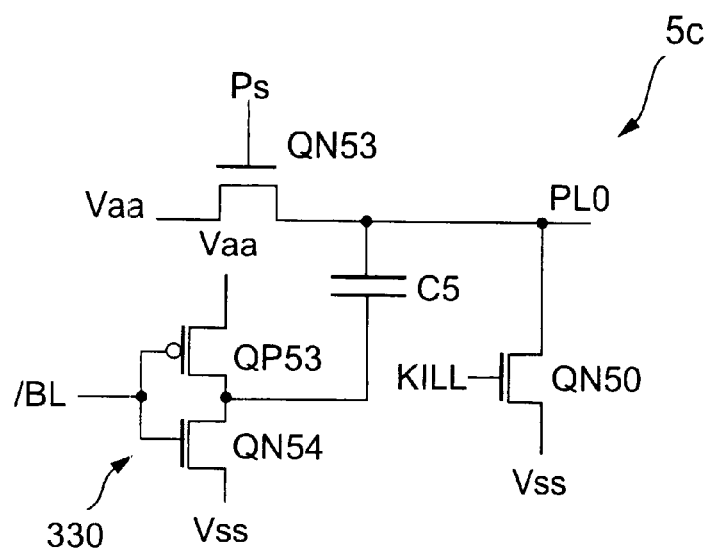
FIG. 33 is a circuit diagram showing the circuit construction of a plate line driving circuit of the eighteenth preferred embodiment of a ferroelectric memory according to the present invention.

FIG. 33 is circuit diagram showing the construction of the eighteenth preferred embodiment of a plate line driving circuit 5c according to the present invention. The plate line driving circuit 5c in this preferred embodiment uses a capacitor C5, one end of which is connected to a plate line PL0 and the other end of which is connected to a booster driving circuit 330 comprising a PMOS transistor QP53 and an NMOS transistor QN54. The plate line PL0 is connected to a resetting NMOS transistor QN50, and is provided with an NMOS transistor QN53 for supplying a voltage Vaa to the plate line PL0. The NMOS transistor QN53 is a precharging transistor for precharging Vaa to a capacitor C4.

Figure 34:
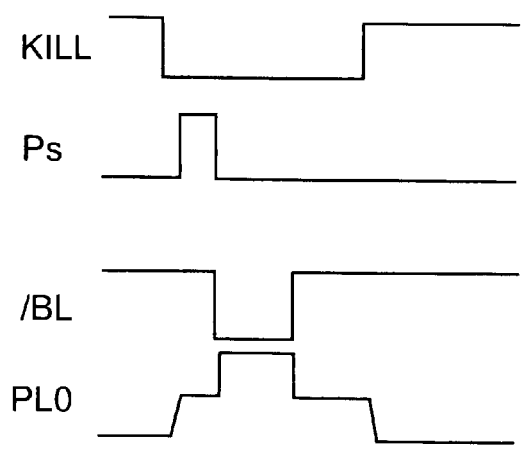
FIG. 34 is a waveform illustration showing the operation of the ferroelectric memory in the eighteenth preferred embodiment.
Figure 35:
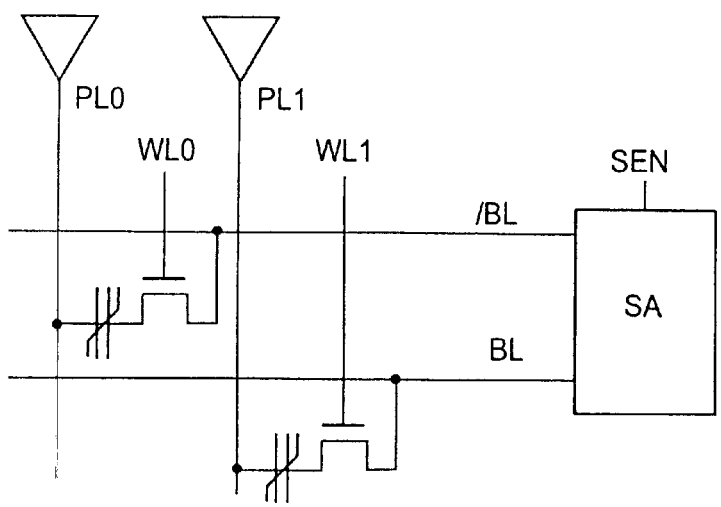
FIG. 35 is a circuit diagram showing the circuit construction of a conventional ferroelectric memory.
Figure 36:
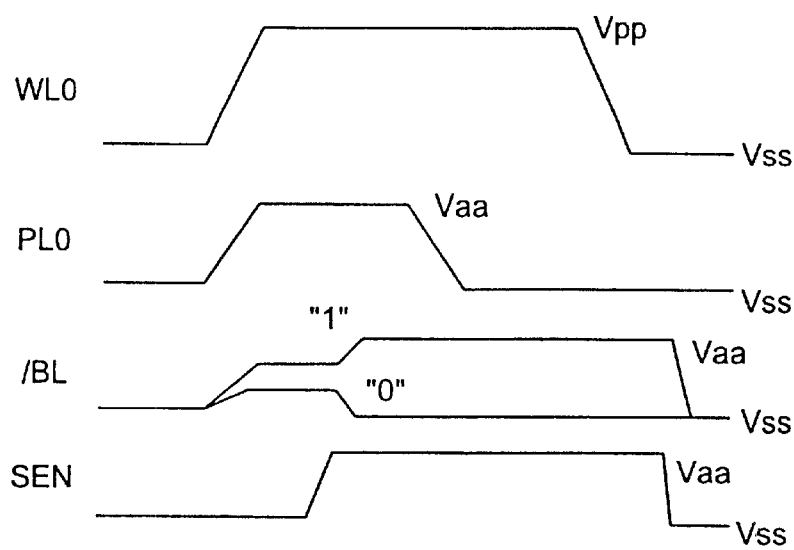
FIG. 36 is a waveform illustration showing the operation of the conventional ferroelectric memory shown in FIG. 35.
Figure 37:
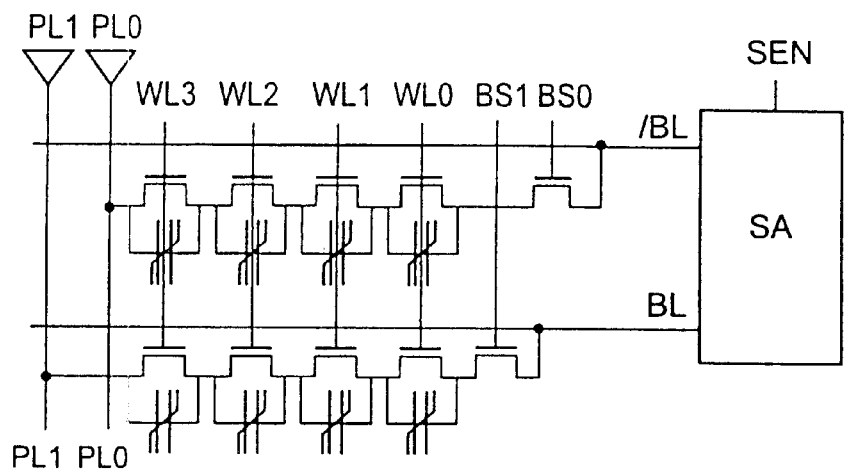
FIG. 37 is a circuit diagram showing the circuit construction of anther conventional ferroelectric memory.
Figure 38:
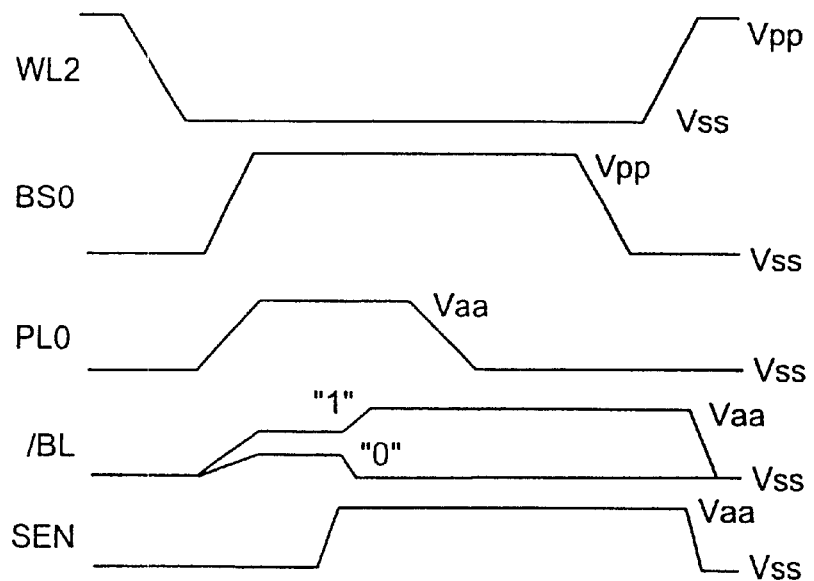
FIG. 38 is a waveform illustration showing the operation of the conventional ferroelectric memory shown in FIG. 37.

As shown in FIG. 34, when the level of a reset signal KILL is an "H" level, the voltage of the plate line PL0 is held to be Vss. In this reset state, the NMOS transistor QN54 of the driving circuit 330 is turned on, and the PMOS transistor QP53 is turned off. When the reset state is canceled and the level of a control signal Ps is raised to an "H" level, a voltage of Vaa−Vt (Vt is a threshold voltage of the NMOS transistor QN53) is applied to the plate line PL0 via the NMOS transistor QN53, and this is charged to the capacitor C5. When the level of the control signal Ps is dropped to an "L" level and the level of a control signal /BT of the driving circuit 330 is dropped to an "L" level, Vaa is applied to the terminal of the capacitor C5, and the voltage of the plate line PL0 is pulled up to 2 Vaa−Vt. Therefore, it is possible to obtain a plate line driving voltage waveform similar to those in the sixteenth and seventeenth preferred embodiment.

As described above, according to the present invention, it is possible to obtain a ferroelectric memory device capable of obtaining a large signal quantity by applying a high voltage, which is the same as that during a writing (rewriting) operation, to a ferroelectric capacitor during a data reading operation.

While the present invention has been disclosed in terms of the preferred embodiment in order to facilitate better understanding thereof, it should be appreciated that the invention can be embodied in various ways without departing from the principle of the invention. Therefore, the invention should be understood to include all possible embodiments and modification to the shown embodiments which can be embodied without departing from the principle of the invention as set forth in the appended claims.

What is claimed is:

1. A semiconductor memory device comprising:
    a memory cell array having a plurality of memory cells, each of which has a ferroelectric capacitor and a transistor, said memory cells being selected by one of word lines, one end of said ferroelectric capacitor of each of said memory cells being connected to a plate line for applying a driving voltage, and a cell data being read out by a bit line from the other end of said ferroelectric capacitor of each of said memory cells;
    a sense amplifier configured to detect and amplify a signal being read out from said ferroelectric capacitor to said bit line; and
    a bit line voltage control circuit, connected to said bit line, configured to drop a voltage of said bit line, from which a signal is read out, during a data reading operation before said sense amplifier circuit is operated.

2. The semiconductor memory device as set forth in claim 1, wherein said bit line voltage control circuit drops the voltage of said bit line and raises a voltage applied to said ferroelectric capacitor.

3. The semiconductor memory device as set forth in claim 1, wherein said bit line voltage control circuit has at least one capacitor for dropping the voltage of said bit line by a capacitive coupling to the bit line.

4. The semiconductor memory device as set forth in claim 3, wherein said capacitor has a capacity which is 10% or more as large as the capacity of said bit line.

5. The semiconductor memory device as set forth in claim 1, wherein said bit line voltage control circuit has a pair of capacitors, each of which is provided in a corresponding one of a pair of bit lines and each of which is driven so as to be connected to a selected bit line of said pair of capacitors.

6. The semiconductor memory device as set forth in claim 1, wherein said bit line voltage control circuit has a pair of capacitors, each of which is provided in a corresponding one of a pair of bit lines, a first terminal of each of said pair of capacitors being connected to a corresponding one of said pair of bit lines, and a second terminal of each of said pair of capacitors being connected to a corresponding one of a pair of driving signal lines, and
    wherein a first potential is applied to said pair of driving signal lines before a data reading operation, and a second potential which is lower than said first potential is applied to one of said pair of driving signal lines during the data reading operation.

7. The semiconductor memory device as set forth in claim 1, wherein said bit line voltage control circuit has first and second transistors, the drain of each of said first and second transistors being connected to a pair of bit lines, and a capacitor, one end of which is connected to the sources of said first and second transistors and the other end of which is connected to a driving signal line, and
    wherein a first potential is applied to said driving signal line and said first and second transistors are turned on before a data reading operation, and
    one of said first and second transistors on the side of an unselected bit line is turned off and a second potential which is lower than said first potential is applied to said driving signal line during the data reading operation.

8. The semiconductor memory device as set forth in claim 1, wherein said bit line voltage control circuit has a first transistor, the drain of which is connected to said bit line, a capacitor, one end of which is connected to the source of said first transistor and the other end of which is connected to a driving signal line, and a second transistor which is provided between a connection node of said first transistor to said capacitor and a power supply line of a first potential, and
    wherein before a data reading operation, a second potential which is higher than said first potential is applied to said driving signal line, said first transistor being turned off and said second transistor being turned on, and
    during the data reading operation, said second transistor is turned off and said first transistor is turned on to apply a third potential, which is lower than said second potential, to said driving signal line.

9. The semiconductor memory device as set forth in claim 1, wherein said bit line voltage control circuit drops a voltage of said bit line after a driving voltage is applied.

10. The semiconductor memory device as set forth in claim 1, wherein said memory cell array has a unit memory cell comprising a ferroelectric capacitor and a transistor connected to said ferroelectric capacitor in series.

11. The semiconductor memory device as set forth in claim 1, wherein said memory cell array has a plurality of unit memory cells, each of which comprises a ferroelectric capacitor and a transistor connected to said ferroelectric capacitor in parallel and which are connected in series, one end of said memory cell array being connected to a plate line, and the other end thereof being connected to the bit line via a block selecting transistor to form a cell block.

12. The semiconductor memory device as set forth in claim 1, wherein said bit line voltage control circuit comprises:

first and second transistors, the drain of each of said first and second transistors being connected to a pair of bit lines;

a capacitor, one end of which is connected to the sources of said first and second transistors and the other end of which is connected to a driving signal line;

a third transistor, one end of which is connected to one end of said capacitor and the other end of which is connected to a power supply line of a first potential, and wherein before a data reading operation, said first and second transistors are turned off, and said third transistor is turned on, said first potential being applied to one end of said capacitor, and a second potential which is higher than said first potential being applied to said driving signal line and the other end of said capacitor, and during the data reading operation, said third transistor is turned off, and said first or second transistor connected to a bit line, from which a cell data is read out, is turned on, a third potential which is lower than said second potential being applied to said driving signal line and the other end of said capacitor.

* * * * *